United States Patent [19]

Gleason et al.

[11] Patent Number: 6,153,269
[45] Date of Patent: Nov. 28, 2000

[54] CHEMICAL VAPOR DEPOSITION OF FLUOROCARBON POLYMER THIN FILMS

[75] Inventors: Karen K. Gleason, Lexington; Scott J. H. Limb, Cambridge; Edward F. Gleason, Lexington; Herbert H. Sawin, Chestnut Hill; David J. Edell, Lexington, all of Mass.

[73] Assignee: Massachusetts Institute of Technology, Cambridge, Mass.

[21] Appl. No.: 09/280,196

[22] Filed: Mar. 29, 1999

Related U.S. Application Data

[62] Division of application No. 08/643,721, May 6, 1996, Pat. No. 5,888,591.

[51] Int. Cl.⁷ ........................................... C08J 7/18
[52] U.S. Cl. ................ 427/490; 427/255.6; 427/573; 427/585
[58] Field of Search ................. 427/522, 255.6, 427/490, 570, 585, 573

[56] References Cited

U.S. PATENT DOCUMENTS

| | | | |
|---|---|---|---|
| 4,536,179 | 8/1985 | Anderson et al. | 604/266 |
| 4,921,723 | 5/1990 | Nichols et al. | 427/41 |
| 5,153,986 | 10/1992 | Brauer et al. | 29/846 |
| 5,244,730 | 9/1993 | Nguyen et al. | 428/336 |
| 5,302,420 | 4/1994 | Nguyen et al. | 427/490 |
| 5,380,557 | 1/1995 | Spiro | 427/249 |
| 5,888,591 | 3/1999 | Gleason et al. | |

FOREIGN PATENT DOCUMENTS

| | | | |
|---|---|---|---|
| 0230993 | 8/1987 | European Pat. Off. | C08J 7/18 |
| 0531029 | 3/1993 | European Pat. Off. | C23C 16/26 |
| 1106071 | 3/1968 | United Kingdom | C08F 1/22 |

OTHER PUBLICATIONS

Morosoff et al., "Free Radicals Resulting from Plasma Polymerization and Plasma Treatment," *J. Macromol. Sci–Chem.*, vol. A10, No. 3, pp. 451–471, 1976. (no month avail).

H. Yasuda, "Plasma for Modification of Polymers," *J. Macromol. Sci.–Chem.*, vol. A10, No. 3, pp. 383–420, 1976. (no month avail.).

Yasuda et al., "Some Aspects of Plasma Polymerization Investigated by Pulsed R.F. Discharge," *Jnl of Polymer Science: Polymer Chemistry Edition*, Vol. 15, pp. 81–97, 1977. (no month avail.).

(List continued on next page.)

*Primary Examiner*—Bernard Pianalto
*Attorney, Agent, or Firm*—Theresa A. Lober

[57] ABSTRACT

Provided are methods for forming a fluorocarbon polymer thin film on the surface of a structure. In one method, a monomer gas is exposed to a source of heat having a temperature sufficient to pyrolyze the monomer gas and produce a source of reactive $CF_2$ species in the vicinity of the structure surface. The structure surface is maintained substantially at a temperature lower than that of the heat source to induce deposition and polymerization of the $CF_2$ species on the structure surface. In another method for forming a fluorocarbon polymer thin film, the structure is exposed to a plasma environment in which a monomer gas is ionized to produce reactive $CF_2$ species. The plasma environment is produced by application to the monomer gas of plasma excitation power characterized by an excitation duty cycle having alternating intervals in which excitation power is applied and in which no excitation power is applied to the monomer gas. The monomer gas employed in the methods preferably includes hexafluoropropylene oxide. The monomer gas pyrolysis and plasma excitation methods can be carried out individually, sequentially, or simultaneously. Flexible fluorocarbon polymer thin films can thusly be produced on wires, twisted wires, neural probes, tubing, complex microstructures, substrates, microfabricated circuits, and other structures. The thin films have a compositional $CF_2$ fraction of at least about 50%, a dielectric constant of less than about 1.95, and a crosslinking density of less than about 35%.

8 Claims, 8 Drawing Sheets

OTHER PUBLICATIONS

Hsu et al., "Kinetics and Mech. of Reactions of CF, CHF, & $CF_2$ Radicals," in Fluorine–Containing Free Radicals, Ch. 5, pp. 128–151; John Root, Ed., *ACS Symp. Series*, No.66, 1978 (no month avail).

Kay et al. "Plasma Chemistry of Fluorocarbons as Related to Plasma Etching and Plasma Polymerization," *Topics in Current Chemistry–Plasma Chemistry III*, pp. 25–35, Veprek et al. Eds., Ny, NY, 1980 (no month avail).

Dilks et al, "Plasma Polymerization of Ethylene and the Series of Fluorethylenes: Plasma Effluent Mass Spectrometry and ESCA Studies," *Macromolecules*, vol. 14, pp. 855–862, 1981. (no month avail.).

Clark et al., "Plasma Polymerization. VI. An ESCA Investigation of the RF Plasma Polymerization of Perfluoro–2–Butyl Tetrahydrofuran," *Jnl. of Polymer Sci: Polymer Chemistry Edition*, vol. 20, pp. 691–706, 1982. (no month avail.).

H. Yasuda, *Plasma Polymerization*, Chapter 6, pp. 73–177 and Chapter 11, pp. 370–389, Academic Press, Inc., New York, New York, 1985. (no month avail.).

d'Agostino et al., "Polymer Film Formation in $C_2F_6$–$H_2$ Discharges," *Thin Solid Films*, vol. 143, pp. 163–175, 1986 (no month avail.).

Ratner et al., "Plasma Deposition and Treatment for Biomedical Applications," *Plasma Depos., Treatment, & Etching of Polymers*, d'Agostino, Ed., Ch. 7, Academic Press, NY, NY 1990. (no month avail.).

d'Agostino et al., "Plasma Polymerization of Fluorocarbons," Plasma Deposition, Treatment, and Etching of Polymers, d'Agostino, Editor, Ch. 2, Academic Press, NY 1990. (no month avail.).

Butler et al., "Properties of micrometer–thick plasma–polymerized tetrafluoroethylene films," *J. Appl. Phys.*, vol. 70, No. 4, pp. 2326–2332, Aug. 15, 1991.

Nason et al., "Deposition of amorphous fluoropolymer thin films by thermolysis of Teflon amorphous fluoropolymer," *Appl. Phys. Lett.*, vol. 60, No. 15, pp. 1866–1868, Apr. 13, 1992.

Savage et al., "Spectropscopic Characterization of Films Obtained in Pulsed Radio–Frequency Plasma Discharges of Fluorocarbon Monomers," Structure–Property Relations in Polymers, *Advances in Chemistry Series*, vol. 236, pp. 745–768, 1993. (no month avail.).

Abstracts of Japan, No. 93–138379, week 9317, JP5074960, Fujitsu Ltd., Mar. 26, 1993.

Panchalingam et al., "Molecular surface tailoring of biomaterials via pulsed RF plasma discharges," *J. Biomater. Sci. Polymer Edn.*, vol. 5, No. 1/2, pp. 131–145, 1993 (no month avail.).

Blanchet et al., "Laser Ablation and the Production of Polymer Films," *Science*, vol. 262, pp. 8719–721, Oct. 29, 1993.

M. F. Nichols, "Flexible and insulative Plasmalene wire coatings for biomedical applications," ISA Paper #93–011, pp. 77–86, 1993. (no month avail.).

Jansen et al., "Applications of Fluorocarbon polymers in micromechanics and micromachining," *Sensors and Actuators A*, vol. 41–42, pp. 136–140, 1994 (no month avail.).

Endo et al., "Fluorinated amorphous carbon thin films grown by plasma enhanced CVD for low dielectric const. interlayer dielectrics," *J. Appl. Phys.*, vol. 78, No. 2, pp. 1370–1372, Jul 15, 1995.

Panchalingam et al., "Pulsed RF plasma polymerization of Perfluoro–2–Butyl–Tetrahydrofuran," Polymeric Materials: Science and Engineering Proceedings of the ACS Division of Polymeric Materials, Science, and Eng., vol. 67, pp. 256–257, 1992 (no month avail.).

Limb et al., "Growth of fluorocarbon polymer thin films with high $CF_2$ fractions and low danglinh bond concentrations by thermal chemical vapor deposition," *Appl. Phys. Lett.*, vol. 68, No. 20, pp. 2810–2812, May 13, 1996.

CHEMICAL VAPOR DEPOSITION OF FLUOROCARBON POLYMER THIN FILMS

This Application is a Divisional of U.S. patent Ser. No. 08/643,721, filed May 6, 1996, now U.S. Pat. No. 5,888,591.

GOVERNMENT RIGHTS IN THE INVENTION

This invention was made with U.S. Government support under Contract Number NOI-NS-3-2301, awarded by the National Institutes of Health, and under Contract Number F19628-95C-0002, awarded by the Air Force. The U.S. government has certain rights in this invention.

BACKGROUND OF THE INVENTION

This invention relates to polymer thin films, and more particularly relates to polymer thin films having properties like that of bulk polytetrafluoroethylene.

Bulk polytetrafluoroethylene, also known as, e.g., PTFE, $(CF_2)_n$, and Teflon™, is characterized by superior mechanical and electrical properties that are important for a wide range of applications. For example, bulk PTFE is characterized by a low dielectric constant of about 2.1 and a low dielectric loss factor of less than about 0.0003 between about 60 Hz and 30,000 MHz. Bulk PTFE is also characterized by high chemical stability, exemplified by its immunity to even strong alkalis and boiling hydrofluoric acid; low water absorption, exemplified by its water uptake of only about 0.005 weight % in a 24 hour period; and high thermal stability, exemplified by its weight loss of only about 0.05 weight % per hour at about 400° C. A low coefficient of friction of between about 0.05–0.08 and a low permeability constant also characterize bulk PTFE. Bulk PTFE is also well-accepted as a substantially bio-compatible material that is tolerable by biological systems such as the human body.

Many biomedical and other applications are not optimally addressed by bulk PTFE, however. For example, biologically-implantable devices such as neural probes, catheter inserts, implantable tubing, and other such devices, all of which are becoming increasingly complicated in geometry, are preferably encapsulated with a film to render the devices impervious to a biological environment, rather than being housed in a bulky PTFE package structure. Such implantable devices typically require of an encapsulating film not only the desired biological compatibility, but due to complex topology and connections to lead wires and associated circuitry, also inherently require an encapsulating film to be conformal and thin, as well as electrically insulating, tough, and flexible. Such a film should further be a good permeation barrier against the implantation environment. A bulk PTFE package structure is thus not optimally applicable to such configurations.

The properties of bulk PTFE are also desirable for thin films employed in the area of microelectronic circuit fabrication. As the desired speed of microfabricated circuits continues to increase, insulating thin films characterized by a correspondingly lower dielectric constant are needed to microfabricate circuit devices having requisite lower characteristic time constants. Additionally, as the functional complexity of microfabricated circuits increases, e.g., with an increasing number of conducting multi-layer interconnects, robust, low-dielectric insulating films are needed to maintain reliable electrical isolation of the multi-layer interconnects as well as to support vias between the layers. Further, robust encapsulation barrier films for microfabrication circuits are becoming increasingly important as circuit applications with harsh operating environments are developed.

There have been proposed various film deposition processes devised with the aim of producing thin films having properties similar to that of bulk PTFE. For example, continuous radio-frequency plasma-enhanced chemical vapor deposition techniques have been proposed for producing PTFE-like films. The films typically produced by such processes have been found, however, to be substantially lacking in one or more critical properties. In particular, the stoichiometry of the resulting films generally differs rather widely from that of bulk PTFE. A typical ratio of fluorine to carbon (F/C ratio) for these films is only about 1.6, whereas bulk PTFE is characterized by a F/C ratio of 2.0. The films produced by various proposed processes are also typically characterized by a low fraction of $CF_2$ groups; in contrast, bulk PTFE is composed substantially of $CF_2$ groups. The high degree of crosslinking corresponding to low $CF_2$ fractionality results in film brittleness, which is unacceptable for applications in which it is desired to encapsulate a flexible, bendable structure in a fluorocarbon film.

Furthermore, carbon-1s X-ray photoemission spectroscopy (XPS) of films deposited by various of the proposed processes reveals that in addition to requisite $CF_2$ groups, comparable concentrations of unwanted moieties such as $CF_3$, CF, and quaternary carbon moieties are also found in the deposited films. Also, unlike bulk PTFE, films produced by the proposed processes typically contain carbon—carbon double bonds and further contain a significant concentration of dangling bonds. The unpaired electrons of these dangling bonds can be present in concentrations as high as about $10^{18}$–$10^{20}$ spins/cm$^3$, and result in highly reactive film surface sites.

Taken together, these various unwanted moieties and defects present in typical encapsulating films result in film properties that are sharply degraded below that of bulk PTFE. For example, the dangling bonds in the films, being reactive sites, can react with atmospheric oxygen or water, producing aging effects that result in undesirable film property variations over time. The dielectric properties of the films are also degraded, resulting in, e.g., an increased dielectric loss. The chemical and thermal stability of the films are also degraded, due to the suboptimal film stoichiometry. Thus, deposition techniques devised in an effort to duplicate properties of bulk PTFE for thin-film applications have generally resulted in only suboptimal thin films that typically cannot adequately address performance requirements of PTFE thin film applications.

SUMMARY OF THE INVENTION

The invention overcomes limitations of prior deposition processes to enable production of fluorocarbon polymer thin films having materials properties of bulk PTFE, and addresses the many biomedical and microfabrication applications for such a film. Accordingly, in one aspect, the invention provides a method for forming a fluorocarbon polymer thin film on the surface of a structure. This is accomplished by exposing a monomer gas to a source of heat having a temperature sufficient to pyrolyze the monomer gas and produce a source of reactive $CF_2$ species in the vicinity of the structure surface. The structure surface is maintained substantially at a temperature lower than that of the heat source to induce deposition and polymerization of the $CF_2$ species on the structure surface.

Preferably, the monomer gas includes hexafluoropropylene oxide, and the heat source preferably is a resistively-heated conducting filament suspended over the structure surface or a heated plate having a pyrolysis surface that faces the structure. The heat source temperature is preferably greater than about 500 K and the structure surface is preferably substantially maintained at a temperature less than about 300 K.

The structure on which surface the film is formed can be, in exemplary embodiments, a length of wire, a substrate, a neural probe, a razor blade, or a microstructure having multiple surfaces all maintained substantially at a temperature lower than that of the heat source.

In other embodiments, a first step of applying plasma excitation power to the monomer gas is carried out, and a last step of applying plasma excitation power to the monomer gas is carried out. In an exemplary embodiment, the monomer gas is not substantially pyrolyzed during plasma excitation power application. In other embodiments, the monomer gas is exposed to the heat source simultaneously with application of plasma excitation power to the monomer gas. Whenever plasma excitation power is applied, it preferably is characterized by an excitation duty cycle having alternating intervals in which excitation power is applied and in which no excitation power is applied to the monomer gas.

In another aspect, the invention provides a method for coating a nonplanar and flexible structure with a flexible fluorocarbon polymer film. The coating is accomplished by exposing the structure to a plasma environment in which a monomer gas is ionized to produce reactive $CF_2$ species. The plasma environment is produced by application to the monomer gas of plasma excitation power characterized by an excitation duty cycle having alternating intervals in which excitation power is applied and in which no excitation power is applied to the monomer gas; the monomer gas preferably includes hexafluoropropylene oxide.

Preferably, the interval of the plasma excitation power duty cycle in which excitation power is applied is between about 100 microseconds and 0.1 seconds, and more preferably between about 1 millisecond and 100 milliseconds, and the interval of the plasma excitation power duty cycle in which no excitation power is applied is preferably between about 100 microseconds and 1 second, and more preferably between about 350 milliseconds and 450 milliseconds. The plasma excitation preferably provides a power of between about 100 and 300 Watts, with the plasma environment being produced at a pressure of between about 1 milliTorr and 10 Torr.

The invention also provides a method for substantially encapsulating a length of wire in a flexible fluorocarbon polymer thin film. In the method, the wire length is supported on a wire holder such that surfaces of the wire length are substantially unmasked and portions of the wire length are out of contact with each other. The wire length is exposed to a plasma environment in which a monomer gas is ionized to produce reactive $CF_2$ species, with the plasma environment being produced by application to the monomer gas of plasma excitation power characterized by an excitation duty cycle having alternating intervals in which excitation power is applied and in which no excitation power is applied to the monomer gas.

In embodiments provided by the invention, the encapsulation process also includes the step of exposing the monomer gas to a heat source to pyrolyze the monomer gas and produce a source of reactive $CF_2$ species in the vicinity of the wire length, which is, e.g., between about 10 microns and 100 microns in diameter. The wire length is substantially maintained at a temperature lower than that of the heat source to induce deposition and polymerization of the $CF_2$ species on the wire length.

In another aspect of the invention, there is provided a method for casting a flexible structure in a desired configuration. This is accomplished by deforming the structure into the desired configuration and exposing the deformed structure to a plasma environment in which a monomer gas is ionized to produce reactive $CF_2$ species. The plasma environment is here produced by application to the monomer gas of plasma excitation power characterized by an excitation duty cycle having alternating intervals in which excitation power is applied and in which no excitation power is applied to the monomer gas. Exposure of the deformed structure to the plasma environment is maintained for a duration sufficient to produce on the deformed structure a fluorocarbon polymer film having a thickness of more than about 5 microns.

In other aspects, the invention provides a length of wire that includes a wire core and a flexible fluorocarbon polymer thin film encapsulating the wire core along at least a portion of the wire length. The polymer thin film has a compositional $CF_2$ fraction of at least about 50%, a dielectric constant of less than about 1.95, and a crosslinking density of less than about 35%. Preferably, the compositional $CF_2$ fraction of the film is at least about 60%. In one embodiment, the wire core has a diameter of between about 10 microns and 100 microns and the film has a thickness of between about 0.1 microns and 100 microns. Preferably, the polymer thin film has a fluorine to carbon ratio of greater than about 1.8.

The invention also provides a length of twisted wire that includes a plurality of entwined wires and a flexible fluorocarbon polymer thin film encapsulating the entwined wire plurality along at least a portion of the twisted wire length. Also provided by the invention is a length of tubing that includes a thin-walled, flexible polymeric cylinder and flexible fluorocarbon polymer thin film on an outer surface of the cylinder along at least a portion of the tubing length. The polymer thin film provided in these embodiments preferably has a compositional $CF_2$ fraction of at least about 50%, a dielectric constant of less than about 1.95, and a crosslinking density of less than about 35%.

In another aspect, there is provided by the invention a neural probe. The neural probe includes a substantially cylindrical shaft portion having a diameter less than about 100 microns and a tip portion connected to the shaft portion by a tapered shaft portion. The tip has a diameter less than about 15 microns. A flexible fluorocarbon polymer thin film encapsulates the tapered shaft portion and cylindrical shaft portion of the probe. The polymer thin film has a compositional $CF_2$ fraction of at least about 50%, a dielectric constant less than about 1.95, and a crosslinking density less than about 35%. Preferably, the compositional $CF_2$ fraction is at least about 60% and the polymer thin film is between about 1 micron and 20 microns in thickness.

The invention additionally provides a substrate having a fluorocarbon polymer thin film of less than about 20 microns in thickness thereon; and further provides a microfabricated electronic circuit including at least one conducting layer having a fluorocarbon polymer thin film of less than about 20 microns in thickness thereon. In embodiments provided by the invention, the compositional $CF_2$ fraction of the polymer thin film on the substrate or conducting layer is at least about 70%, and the dielectric constant is less than about 1.95.

In exemplary embodiments, the polymer thin film on the substrate or conducting layer has a dangling bond density less than about $10^{18}$ spins/cm$^3$, a crosslinking density less than about 15%, a dielectric constant less than about 1.8, and preferably has a compositional CF$_2$ fraction of at least about 85%.

The various methods of forming fluorocarbon polymer thin films provided by the invention, and the resulting films, address a wide range of thin film applications for bulk PTFE, including biomedical and microfabrication applications, as well as numerous mechanical configurations in which a thin coating of PTFE-like material is desired. Other features and advantages of the invention will be apparent from the claims, and from the following detailed description.

DETAILED DESCRIPTION

The thin film deposition processes provided by the invention enable tailoring of the chemical composition of deposited films to produce fluorocarbon polymer thin films having stoichiometry and materials properties similar to that of bulk PTFE. The thin films resulting from the processes of the invention have superior materials properties over prior thin films, which generally fail to match the materials properties of bulk PTFE.

Figure 1:
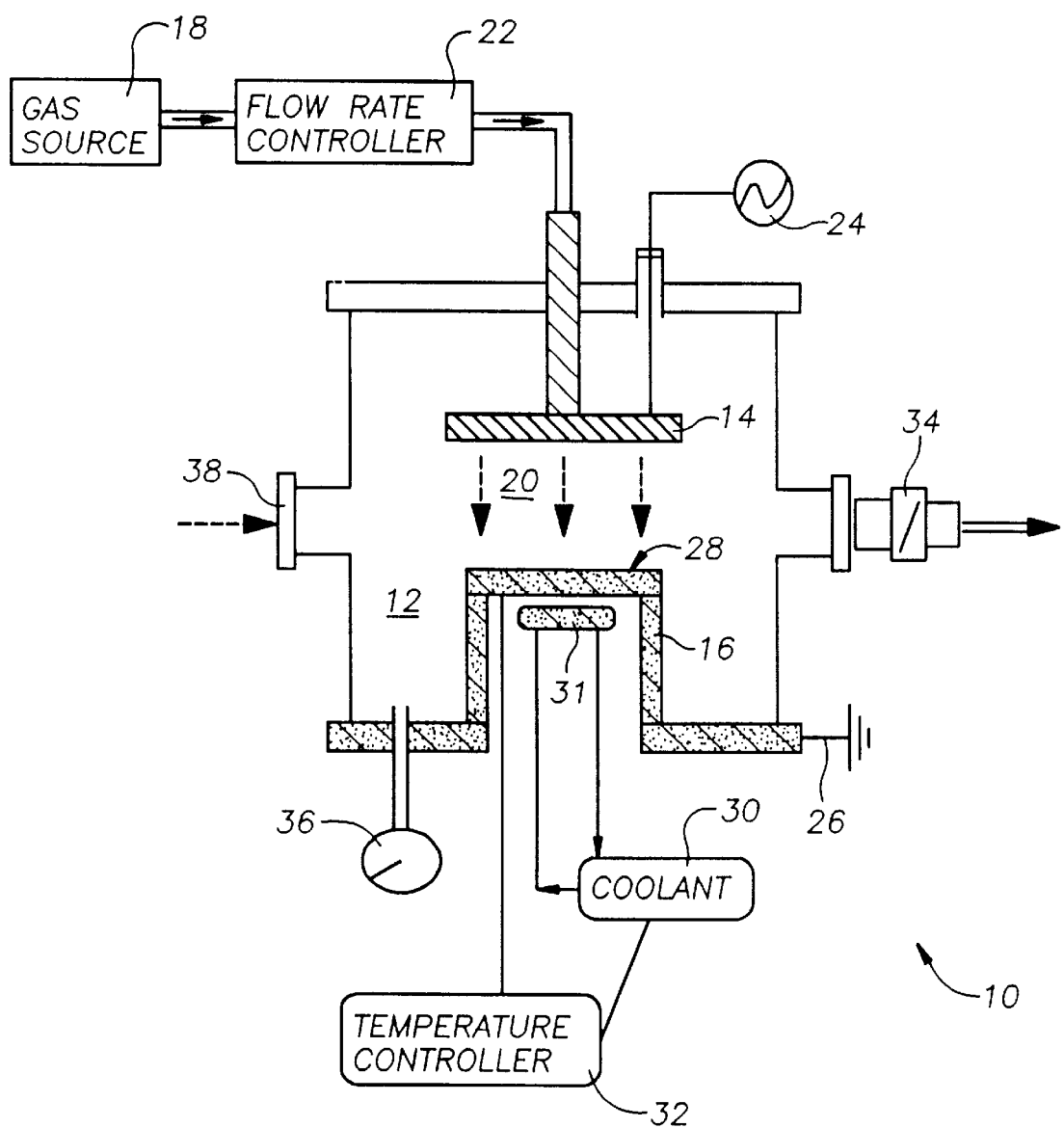
FIG. 1 is a schematic diagram of a vacuum chamber apparatus suitable for carrying out the film deposition processes provided by the invention.

In a first deposition process in accordance with the invention, a structure to be coated with a PTFE-like thin film is exposed to a fluorocarbon monomer species under pulsed-plasma-enhanced chemical vapor deposition conditions (pulsed PECVD conditions). An rf plasma deposition system like that schematically illustrated in FIG. 1 can be employed for carrying out the deposition process. As will be recognized by those skilled in the art, other conventional plasma deposition systems can alternatively be employed. The example deposition system 10 includes an air-tight vacuum chamber 12 formed of, e.g., steel, and includes a powered electrode 14 and a ground electrode 16 each formed of, e.g., aluminum.

The powered electrode 14 is preferably configured with connection to a feed gas source 18 such that the gas 20 is introduced into the chamber, e.g., through tubes in the powered electrode in a conventional shower-head configuration. Preferably, the showerhead tubes provide a reasonably equal flow of gas per unit area of the upper electrode. Accordingly, the shower-head tubes should be spaced such that the concentration of the gas injected out of the shower-head is relatively uniform. The number and spacing of the tubes is dependent upon the specific pressure, electrode gap spacing, temperature, and other process parameters, as will be recognized by those skilled in the art. For example, for a typical process employing a pressure of about 1 Torr and an electrode gap spacing of about 1 cm, the shower-head tube spacing is about 1 cm.

A flow rate controller 22 is preferably provided to enable control of the flow of gas through the powered electrode into the chamber. The powered electrode is also connected electrically to a radio frequency (rf) power source 24, or other suitable power source, for producing a plasma of the feed gas in the chamber.

The grounded electrode 16 is connected electrically to a ground 26 of the vacuum chamber system. Preferably, the grounded electrode 16 provides a surface 28 for supporting a substrate or other structure onto which a thin film is to be deposited. The grounded electrode and its support surface are preferably cooled by way of a cooling system including, e.g., a coolant loop 30 connected to cooling coils 31 and a temperature controller 32, enabling a user to set and maintain a desired electrode temperature by way of, e.g., water cooling.

A pump 34 is provided for evacuating the deposition chamber to a desired pressure; the pressure of the chamber is monitored by way of, e.g., a pressure gauge 36. Also preferably provided is an analysis port 36 for enabling a user to monitor progress of the deposition process.

The pulsed PECVD film deposition process of the invention, as described below, produces a flexible, conformal fluorocarbon coating that can be applied to a wide range of structures including complex three-dimensional geometries. Planar substrates, e.g., conventional microfabrication wafer substrates, or other planar structures, can also be singly or batch processed. In a single-substrate process, the substrate is supported on the grounded electrode 28. In a multi-substrate process, a plurality of substrates can be suspended in the vacuum chamber between the powered and grounded electrode by way of, e.g., an aluminum substrate boat, vertically supported by, e.g., a chamber sidewall anchor, and having support slots for holding substrates in a desired configuration. Preferably, the selected multi-substrate support configuration enables a user to adjust individual substrates' positions without substantial complexity; such substrate position adjustment may be desirable at intervals during a deposition process for enhancing deposition uniformity across the span of a substrate.

Deposition of a fluorocarbon polymer thin film provided by the invention can also be carried out on cylindrical objects such as thin cylindrical structures. For example, interconnection wires for integrated circuits, lead wires for pacemakers and other biomedical devices, and in general, any wiring structure for which a PTFE-like coating is desired, can be coated by the deposition process provided by the invention. Importantly, because the deposition conditions, as outlined below, enable room-temperature deposition, many wiring materials can be accommodated by the process. For example, single-stranded stainless steel or copper wire, or twisted groups wires such as twisted filler wires used in pace-maker leads, can be accommodated by the process.

Figure 2A:
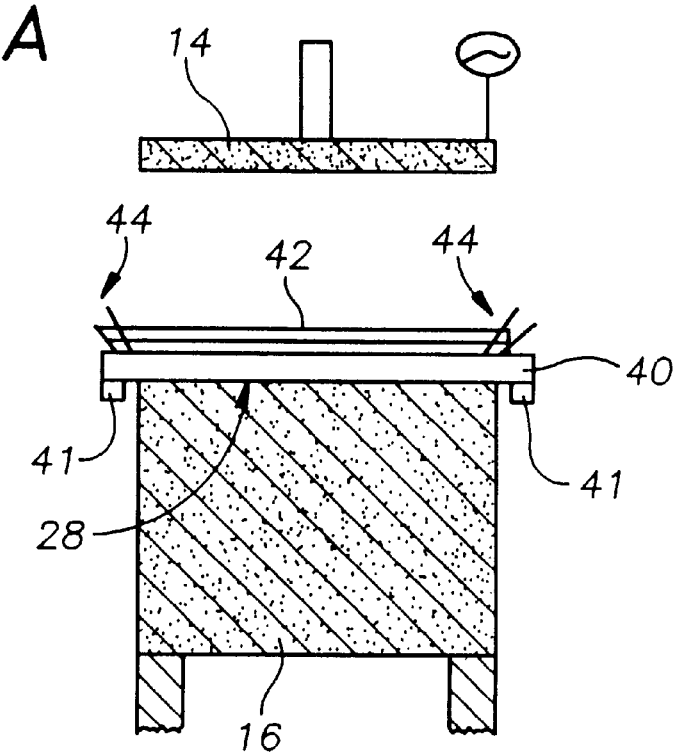
FIG. 2A and FIG. 2B are side-view and top-view schematic diagrams, respectively, of a support holder for supporting a length of wire to be processed in accordance with the invention in the vacuum chamber of FIG. 1.
Figure 2B:
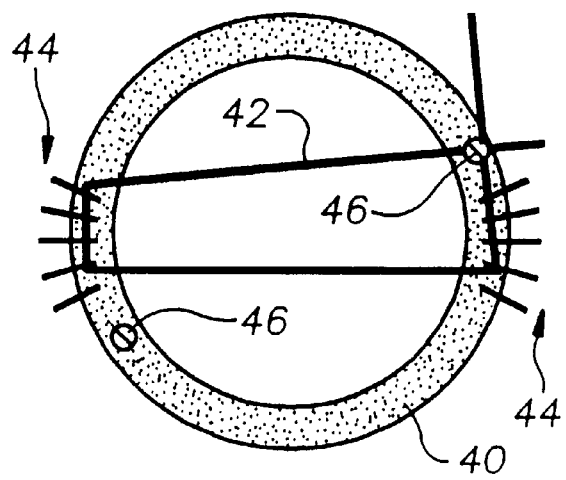

Referring to FIGS. 2A and 2B, the invention provides a wire holder for supporting wire on which a PTFE-like coating is to be deposited in the deposition chamber. In one example configuration, the wire holder includes a holding ring 40, e.g., an aluminum ring, with a peripheral edge ridge 41. The holding ring and edge ridge geometry preferably correspond to the shape of the support surface 28 of the grounded electrode 16. With this geometry, the holding ring can be mated with the grounded electrode. As shown in both the cross-sectional view of FIG. 2A and the top-down view of FIG. 2B, the holding ring 40 includes posts 44, e.g., aluminum posts, at points around the circumference of the ring, for suspending a length of wire 42 above the grounded electrode 16; preferably, the wire is suspended about 0.5 cm above the grounded electrode. A length of wire to be coated is accordingly wrapped one or more times between the posts at a point on the posts above the holding ring surface preferably such that all sides of the wire are accessible to the deposition plasma between the powered electrode 14 and the grounded electrode 16, and preferably such that no two or more windings or the wire are in contact. One or more screws 46, or other fastening devices, are preferably provided for fastening the length of wire onto the holding ring.

Multiple lengths of wire can be individually fastened to and supported by the holding ring configuration for simultaneous coating of the wires. During the coating process, the one or more lengths of wire can be rotated, but as will be recognized by those skilled in the art, such rotation is not required. Indeed, the nature of the plasma environment produced by the processes of the invention substantially entirely immerses the wires in the plasma. Rotation of the wires can be employed for enhancing the uniformity of the wire coating. In one example rotation technique, the wires are rotated about their longitudinal axis, by, e.g., manually adjusting the wires. In a second example rotation technique, the wires are rotated around points in the deposition chamber. In this case, the holding ring can be configured, e.g., to spin like a record on a turntable such that portions of the wire lengths are periodically moved around the deposition chamber.

As will be recognized by those skilled in the art, various other support structures can be employed to accommodate a cylindrical structure during the deposition process. For example, in the case of coating of a long continuous length of wire, take-off and take-up spools can be provided to enable a continuous coating operation. Here the spools are preferably controllable such that the wire length is drawn through the deposition plasma at selected intervals corresponding to a desired coating thickness, at a continuous rate, or other desired control scheme.

Structures having geometry other than cylindrical and having a wide range of topology are also accommodated by the deposition process of the invention. For example, catheter inserts, neural probes, tubing, shaft structures, and other three-dimensional structures having multiple surfaces can be accommodated. For example, neural probe shaft structures like, e.g., iridium probes, having a cylindrical shaft that tapers to a tip, can be coated by the deposition process provided by the invention. The invention provides a probe holder for supporting one or more probes during the deposition process. One example probe holder includes a PTFE block having one or more holes drilled in the block to a selected depth such that a probe can be supported in each hole. During the deposition process, the PTFE block is supported on the grounded electrode in the deposition chamber; the hole depths are accordingly selected such that the probes are held a desired distance above the grounded electrode. In an example process, the probes are preferably held about 1.0 cm above the grounded electrode.

As mentioned above, the processing conditions of the deposition process enable room-temperature fluorocarbon film deposition. Thus, heat sensitive materials, such as organic polymers like urethanes, can be accommodated by the process. Polymer structures such a polymeric tubing, and other polymer structures can therefore be coated. Low-temperature deposition conditions are also desirable for coating structures that include interfaces of two or more materials that characteristically interdiffuse, or that have different thermal expansion coefficients at relatively higher temperatures. Also, structures containing active biological components, such as enzymes, pharmaceuticals, or live cells, may in many applications be best processed at relatively lower deposition temperatures.

Other than polymer tubing, any tubing structure can be coated by the process provided by the invention. The deposition processes provided by the invention are especially well-suited for deposition on thin-walled tubing, e.g., tubing having a wall thickness of between about $1/128$ inches and $1/4$ inches. In one example, a coating is deposited on the exterior of the tube structure along its length such that during use of the tube to carry gases or liquids, the gases and liquids cannot permeate through the tube wall. In one example deposition process, a length of tubing to be coated is slid over a corresponding length of wire, which in turn is supported on the holding ring shown in FIG. 2. Preferably, the various considerations described above in connection with wire coating are also accounted for in this case. In a second example, one or more lengths of tubing are vertically suspended in the deposition chamber, without the need for an internal wire support. As will be recognized by those skilled in the art, other tubing support techniques are also suitable.

Other complex geometries, e.g., tubing having stabilizing fins, and other three-dimensional structures, can also be accommodated. As will be recognized by those skilled in the art, a support structure, e.g., a bulk PTFE block, or other support structure, can be employed to accommodate a specific object to be coated in the deposition chamber. In addition, reorientation of the object to be coated and its support structure can be enabled by, e.g., manual reorientation during the deposition process, or like the spinning wire holder ring described above, can be designed-in as a mechanism integral to the support structure. Substrate and object reorientation techniques, as are routinely employed in industrial vapor deposition and ion-implantation processes, can correspondingly be employed in the invention to enhance deposition uniformity.

Turning now to the processing conditions prescribed by the pulsed-PECVD deposition process of the invention, it is well-recognized that many complex physical phenomena and interactions occur in any chemical vapor deposition (CVD) environment. For PECVD, experimentally controllable process parameters that affect plasma electron density, electron energy distribution, gas molecule in-chamber residence time, and gas density, as well as process gas flow rate, feed gas composition, plasma excitation frequency, excitation power, chamber pressure, and chamber reactor geometry all directly affect the chemical processes that occur during a PECVD process. Further, the surface geometry of a structure to be coated, as well as the chemical composition of the structure, the structure's temperature, and the structure's electrical potential all affect the nature of the plasma-surface interactions that occur during a PECVD process. Thus, as will be recognized by those skilled in the art, the various process parameters can be adjusted over a wide range to achieve any of a continuum of deposition process conditions. Preferably, the various parameters are controlled such that the deposition process is optimized for a given structure geometry, composition, and application.

Whatever process parameters are selected, an initial adhesion-promotion step can be employed prior to the deposition process to enhance and promote adhesion of the depositing species on a given structure. For example, an adhesion promoter can be spin-applied to a planar substrate or sprayed on to a complex geometrical object. Alternatively, an adhesion promoter can be vapor-deposited in situ in the deposition chamber just prior to the fluorocarbon polymer film deposition process. Examples of suitable adhesion promoters include 1H, 1H, 2H, 2H-Perfluorodecyltriethoxysilane; 1H, 1H, 2H, 2H-Perfluorooctyltriethoxysilane; 1H, 1H, 2H, 2H-Perfluoroalkyltriethoxysilane; perfluorooctyltriclorosilane; all classes of vinyl silanes, as well as other adhesion promoters, as will be recognized by those skilled in the art. lIn the pulsed-PECVD deposition process provided by the invention, a plasma is provided in the deposition chamber by pulsing the rf excitation, or other plasma excitation, applied to the feed gas introduced into the chamber. In other words, the rf excitation power is alternately turned on and off with a desired duty cycle, rather than being applied as a continuous plasma excitation. This pulsed-plasma excitation technique enables a much wider range of process control than is typical of conventional, continuous-plasma deposition processes. In the invention, the plasma excitation on-time is between about 1 microsecond and 1 second, and the plasma excitation off-time is between about 1 microsecond and 10 seconds. Preferably, to deposit PTFE-like polymer thin films, the plasma excitation on-time is about 10 milliseconds and the plasma excitation off-time is about 400 milliseconds.

During the plasma excitation on-time, ions and reactive neutral species are produced in the feed gas introduced between the electrodes in the deposition chamber. During the plasma excitation off-time, no additional ions or reactive neutral species are produced, and the ions produced during the on-time decay more quickly than the reactive neutral species produced during the on-time. As a result, during the on-time, reactive species deposit and polymerize on the structure and ions bombard the structure, while during the off-time, no significant ion bombardment occurs. As is well-recognized, PECVD processes fundamentally consist of a competing deposition ablation processes as a result of ion bombardment during the deposition. It has been found that with the pulsed-PECVD process of the invention, reasonable film deposition rates are maintained even at small plasma excitation on/off-time ratios. This indicates that the reactive neutral species produced during the plasma excitation on-time of each pulse duty cycle likely survive sufficiently long during the off-time of the pulse duty cycle such that the film growth reaction favors deposition during this time. Thus, the pulsed-PECVD process reduces the degree of ion bombardment of a structure being coated while substantially maintaining reasonable deposition rates.

Ion bombardment is recognized as a principal factor causing damage to a surface on which a film is being deposited, e.g., by causing dangling bond formation. Indeed, it has been found that plasma exposure can even damage the surface of bulk PTFE, producing both significant defluorination and increased crosslinking of the bulk surface, both conditions resulting in degradation of the desired PTFE materials properties. Thin films produced by a continuous-plasma PECVD process are found to exhibit the same distribution of quaternary carbon, CF, $CF_2$, and $CF_3$ moieties as that produced by etching and/or ablation of bulk PTFE by plasma exposure. It is thus recognized that an optimal deposition process for producing thin films having properties resembling bulk PTFE reduces or suppresses deleterious effects due to plasma ion bombardment of the depositing film.

Considering the range of plasma-excitation duty cycles employed in the invention, it has been found that the film deposition rate, film compositional fraction of $CF_2$ groups, and film dangling bond concentration each increase and then plateau as the plasma excitation off-time is increased about 400 milliseconds, with the plasma excitation on-time held fixed at about 10 milliseconds. Films resulting from an off-time of about 400 milliseconds found to be characterized by a high compositional $CF_2$ fraction, as well as a low dangling bond concentration. Variation of the feed gas flow rate, resulting in a corresponding variation of gas residence time, is found to not alter these results. It is found that this on-off-time ratio results in a deposition rate of about 2 Å per pulse duty cycle, corresponding to the deposition of a full monolayer per cycle. These observations, along with the apparent negative activation energy of the process, suggest that absorption plays a key role in the kinetic mechanism of the pulsed-PECVD deposition process. A fuller discussion of film characteristics will be presented in Example 1 below.

As explained above, it has been found that continuous plasma etching, ablation, and deposition processes result in a distribution of $CF_x$ species; only $CF_2$ groups are desired for producing a PTFE-like film, however. The pulsed-PECVD process of the invention enables the ability to produce a plasma gas of predominantly $CF_2$ species, thereby reducing the fraction of other moieties in the resulting film. The feed gas employed in the deposition process of the invention is also selected to maximize the $CF_2$ reaction species. In particular, the feed gas is selected such that the plasma gas phase decomposition product is predominantly $CF_2$. Example monomers for use as a deposition feed gas include $C_2F_4$, $C_3F_8$, $CF_3H$, $CF_2H_2$, $CF_2N_2$ (difluordiaxirine), $CF_3COCF_3$, $CF_2ClCOCF_2Cl$, $CF_2ClCOCFCl_2$, $CF_3COOH$, difluorohalomethanes such as $CF_2Br_2$, $CF_2HBr$, $CF_2HCl$, $CF_2Cl_2$, and $CF_2FCl$; difluorocyclopropanes such as $C_3F_6$, $C_3F_4H_2$, $C_3F_2Cl_4$, $C_2F_3Cl_3$, and $C_3F_4Cl_2$; trifluoromethylfluorophosphanes such as $(CF_3)_3PF3$, $(CF_3)_2PF_3$, and $(CF_3)PF_4$; or trifluoromethylphosphino compounds such as $(CF_3)_3P$, $(CF_3)_2P—P(CF_3)_2$, $(CF_3)_2PX$, and $CF_3PX_2$, where X is F, Cl, or H. Other monomers can also be employed.

One preferable monomer is hexafluoropropylene oxide ($C_3F_6O$ or HFPO). HFPO is characterized by a highly-strained epoxide ring that enables easy ring-opening reactions with nucleophiles. It has been found that films deposited using HFPO under pulsed-PECVD conditions result in polymer films having a high $CF_2$ fraction and little or no oxygen incorporation. This suggests that neutral reactive species in the plasma produced using this monomer do survive for some time during the plasma excitation off-time of the pulse duty cycle, thereby enabling significant deposition during the off-time, when plasma ion bombardment is significantly reduced. It has been found that films deposited using HFPO under continuous-plasma PECVD conditions exhibit materials properties inferior to those produced under pulsed-plasma PECVD conditions; thus, it is expected that the selected monomer and pulse-plasma excitation conditions synergistically provide the desired PTFE materials properties.

Considering the selection of gas feed monomer in general, it is recognized that the ratio of $CF_x/F$ in the gas directly effects the competing deposition and etching reactions that occur during a plasma-based deposition process; a higher ratio corresponds to enhancement of deposition and suppression of etching reactions. It has been found that this ratio can be increased by including in a feed gas composition a fluorine scavenger, e.g., hydrogen, a hydrocarbon, or an unsaturate. In general, the addition of hydrogen or $C_2F_4$ to a fluorocarbon feed gas is found to result in decreasing atomic F concentration relative to $CF_x$ concentration. This decreased atomic F concentration correspondingly results in increased deposition rate. Additionally, the inclusion of hydrogen in the feed gas can alter the gap-filling capabilities of the deposited film due to its reduction in ion bombardment. Furthermore, hydrogen can be included in a feed gas to provide an in situ mechanism for passivating dangling bonds on the surface of a structure being processed. For example, it is known that hydrogen can passivate amorphous silicon dangling bonds.

The selection of feed gas constituents should also preferably take into consideration any trace impurities that could resultingly be incorporated into a film deposited from the feed gas. For example, HFPO as a feed gas monomer can result in incorporation of trace amount of oxygen in a deposited film. Thus, if trace oxygen is not acceptable for a deposited film, a feed gas monomer other than HFPO is preferable. Other process parameters should likewise preferably be considered in selecting a feed gas monomer, as will be recognized by those skilled in the art.

Turning to other parameters of the pulsed-PECVD process provided by the invention, the rf plasma excitation power ranges between abut 50 to 280 Watts for a 4.5 inch diameter grounded electrode surface, with the power preferably being about 280 Watts. For a given electrode geometry, the preferred power density is about 2.7 Watts/$cm^2$. The rf plasma excitation frequency is set at, e.g., about 13.56 MHz, as is conventional for plasma processes, but other frequencies can be employed. The flow rate of the monomer feed gas ranges between about 1 sccm and 200 sccm, for one conventional reactor geometry, with a flow rate of about 30 sccm preferable for the monomer HFPO. Inert gases such as nitrogen or argon can be added to the monomer feed gas; preferably, no inert gas is included with the monomer HFPO, however.

Variations in power and flow rate effect the plasma concentration and correspondingly effect gas residence time and film deposition rate. Increase in plasma excitation power increases electron densities, and directly enhances the tail of the electron energy distribution function. Also, it has been found that the atomic concentration of fluorine dramatically increases as power is increased, e.g., for a gas consisting of $C_2F_6$ and 20% $H_2$. The $CF_2$ concentration is also found to increase with increasing power to a certain power level, above which it decreases due to recombination of the $CF_2$ with the increased fluorine. Monomer feed gases including hydrogen, however, result in a lower fluorine atom concentration, and therefore result in processes that are less sensitive to power variations. In this case, the deposition rate is found to generally increase with increasing power due to a high concentration of active deposition precursor.

The structure onto which a PTFE-like film is to be deposited can be held at an electrical potential of between about −400 V to +400 V, including a ground potential or floating potential at the potential of the plasma. Ground potential or floating potential are preferred. In general, the energy with which plasma ions bombard the structure's surface decreases with decreasing structure potential, relative to the plasma potential. This energy variability impacts the film deposition rate and the chemical composition of the film. It also affects the film topological coverage.

In the invention, recognition of this energy-dependent ion bombardment is purposefully employed to enable in situ self masking of a structure on which a film is being deposited. In one example application, either the entire surface or only selected surface regions of a neural probe are coated with a polymer film without the use of masking material. A neural probe, as described earlier, consists of a cylindrical shaft which at one end is tapered to a point. If the probe, supported in, e.g., a PTFE block on the lower chamber electrode, is held at a floating potential, whereby it equilibrates to the potential of the plasma, the entire surface of the probe, including the shaft and tip, are coated with the depositing film. In contrast, if the probe is maintained at the ground potential of the grounded electrode, the typically very narrow tip undergoes substantial ion bombardment during the deposition, while the shaft does not. This results in a net film deposition on the shaft and substantially no film deposition on the probe tip. Typical neural probe applications require this very configuration; i.e., the tip of the probe preferably is uncoated such that electrical contact to neural tissue is accomplished, but the shaft of the probe is preferably coated such that its biocompatibility is maximized. Thus, the invention provides the ability to produce an effective masking of selected regions of a structure based on the geometry of the structure and the potential at which the structure is held during the deposition. As will be recognized by those skilled in the art, this example can be extended to other geometries and potentials for producing in situ masking of structural surfaces during the deposition process.

The pressure of the vacuum deposition chamber can be set at a pressure of between about 1 milliTorr to 50 Torr during the deposition process, with a pressure of about 1 Torr being preferable. Pressure variations can result in large changes in plasma species concentrations. Pressure impacts gas residence time directly, impacts average electron energy inversely, and impacts mean free path of radical species proportionally. Generally, a low mean free path, long residence time, and relatively high electron energy produce an environment favorable for deposition conditions. An increase in pressure has been found to result in an increase in $CF_x$ reactive species concentrations, including $CF_2$ concentrations, which as explained earlier is desirable for producing PTFE-like films. The increased reactive species concentration results in correspondingly higher deposition rates. Furthermore, the maximum deposition rate per plasma excitation duty cycle has been found to increase with pressure, all other parameters held constant.

The structure onto which a film is being deposited is held at a temperature of between about −40° C. and +200° C. during the deposition; preferably the temperature is held to about 293 K. The temperature that is maintained during film deposition can be an important factor for determining the ultimate thermal stability of a film produced by the deposition process. Films deposited at relatively higher structural temperatures may in some applications be relatively more resistant to heating. This is a critical property for films to be employed, e.g., as interlayer dielectric materials in microfabrication processes; such films preferably can withstand thermal treatments associated with metallization processes subsequent to their deposition.

The upper powered electrode and lower grounded electrode are preferably spaced apart by, e.g., about 0.25 inches to about 12 inches, depending on the reactor configuration. In the example process described here, the electrode spacing is preferably about 1 inch.

In the deposition process provided by the invention, thermal post-deposition steps can be carried out in situ in the deposition chamber. For example, a post-deposition annealing in air, or in nitrogen or other inert gas, can be employed for, e.g.,. film stress relief, dangling bond passivation, or thermal stability enhancement. Such annealing can be carried out at a temperature of between about 50° C. and 400° C.

Fluorocarbon polymer thin films deposited pursuant to the invention are characterized as smooth, conformal, coatings that exhibit sufficient flexibility to withstand mechanical bending of a three-dimensional structure, e.g., a wire, on which they are deposited. The films exhibit materials properties that closely resemble those of bulk PTFE, thereby enabling a wide range of thin film applications that heretofore have been met with only suboptimal results.

In particular, the fluorine to carbon ratio (F/C ratio) of films provided by the invention is preferably between about 1.1:1–2.2:1; this fluorine-rich composition results in many of the well-known bulk PTFE properties. The $CF_2$ fraction of films provided by the invention are greater than about 50%, and preferably greater than about 60%. Also, the dangling bond density of films provided by the invention is very low, preferably being less than about $10^{18}/cm^3$. The films are also characterized by a low polymer crosslinking density of less than about 35%, and preferably less than about 18%. This results in increased flexibility, which in turn provides film stress relief and enables the films to withstand physical handling and exposure to environments such as biological environments. Films provided by the invention are also characterized by a dielectric constant of between about 1.4 and 1.95. This is much lower than that of previous films attempting to duplicate the dielectric properties of bulk PTFE.

EXAMPLE 1

A fluorocarbon polymer thin film was produced in accordance with the invention by flowing about 25 sccm of undiluted HFPO (from PCR, Inc.) of about 99% purity, into a parallel plate vacuum deposition chamber like that described above. The volume between the upper powered electrode and the lower grounded electrode was about 261 $cm^3$. The reactor was pumped to a pressure of about 1 Torr, and the lower grounded electrode was cooled to maintain it at a temperature of about 293±3 K by way of backside water cooling. An aluminum holding ring was employed on the grounded electrode to support several lengths of stainless steel wire each of about 25 $\mu$m in diameter. The ends of the wires were electrically grounded to the electrode and were maintained in thermal contact with the electrode. The wire lengths, as supported in the holding ring, were held about 0.5 cm above the lower grounded electrode, which was separated from the upper powered electrode by about 1 inch. Films were deposited on the wires by exciting the HFPO feed gas by application of a pulsed plasma excitation. The rf power density was about 2.7 $W/cm^2$ and the rf frequency was about 13.56 MHz. The pulsed plasma excitation duty cycle consisted of a plasma excitation on-time of about 10 ms and a plasma excitation off-time of about 400 ms.

For comparison, a continuous plasma CVD process was also carried out on lengths of stainless steel wire supported in a holding ring on a lower grounded electrode. All process parameters were maintained identical to that of the pulsed-PECVD parameters except for the rf power density; a power density of about 0.49 $W/cm^2$ was employed for the continuous plasma process because it is known that at higher power densities, etching, rather than deposition, occurs.

Figure 3A:
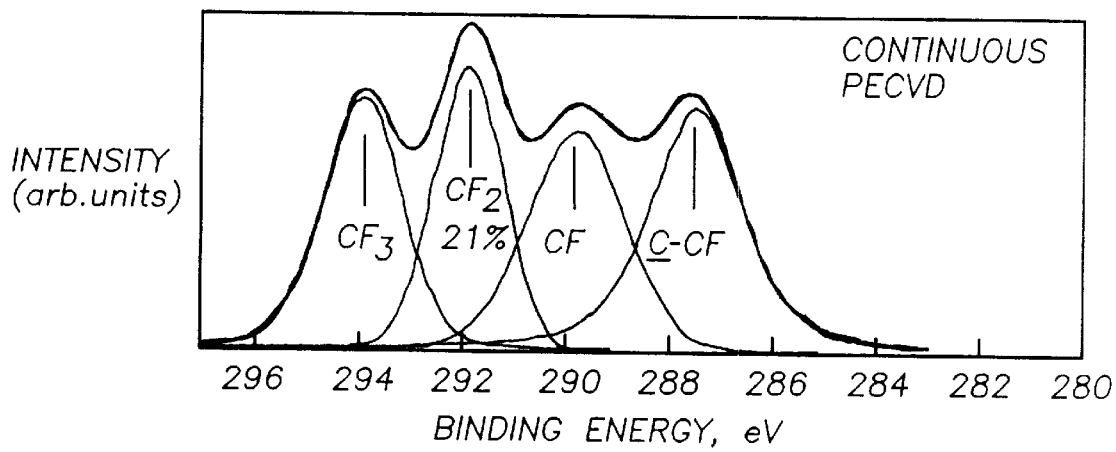
FIGS. 3A, 3B, and 3C are plots of the carbon-1s X-ray photoemission spectra for a fluorocarbon polymer thin film produced by a continuous plasma-enhanced chemical vapor deposition process in the prior art, for a fluorocarbon polymer thin film produced by a pulsed-plasma-enhanced chemical vapor deposition process in accordance with the invention, and for bulk polytetrafluoroethylene, respectively.
Figure 3B:
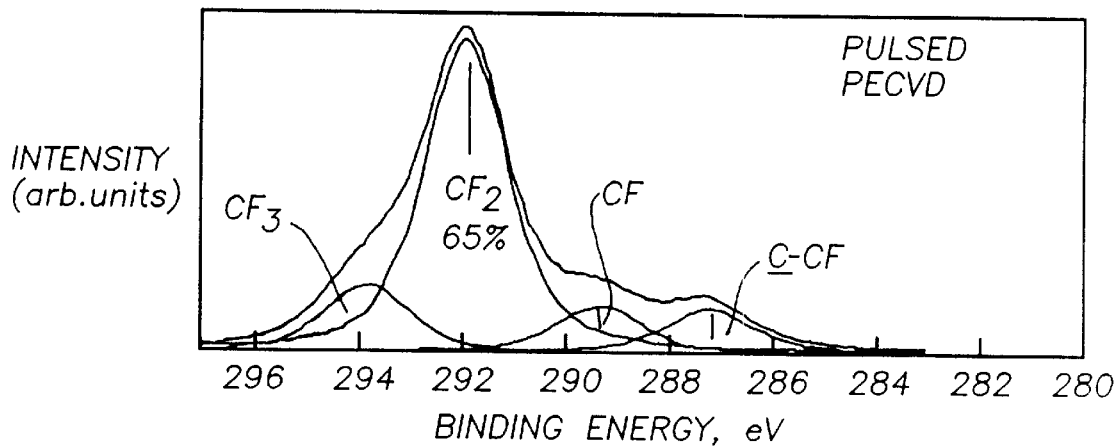

The pulsed-PECVD process and continuous-PECVD processes were each carried out to produce a fluorocarbon coating of a thickness of about 10 $\mu$m on the stainless steel wires. A chemical compositional analysis of the coatings is shown in FIGS. 3A and 3B. The figures show plots of the carbon-1s X-ray photoelectron spectra (XPS spectra) for the films as a function of binding energy. For the continuous-PECVD film, the spectrum peak at 292 eV, as shown in FIG. 3A, is indicative of a $CF_2$ bonding environment. However, deconvolution of the spectrum reveals that the $CF_2$ peak accounts for only about 21% of the spectrum's area, and that the other peaks represent $CF_3$, CF, and C—CF moieties, as shown in the plot. Based on measurement of the areas of these peaks, the F/C ratio of the continuous-PECVD film is given as only about 1.36.

Figure 3C:
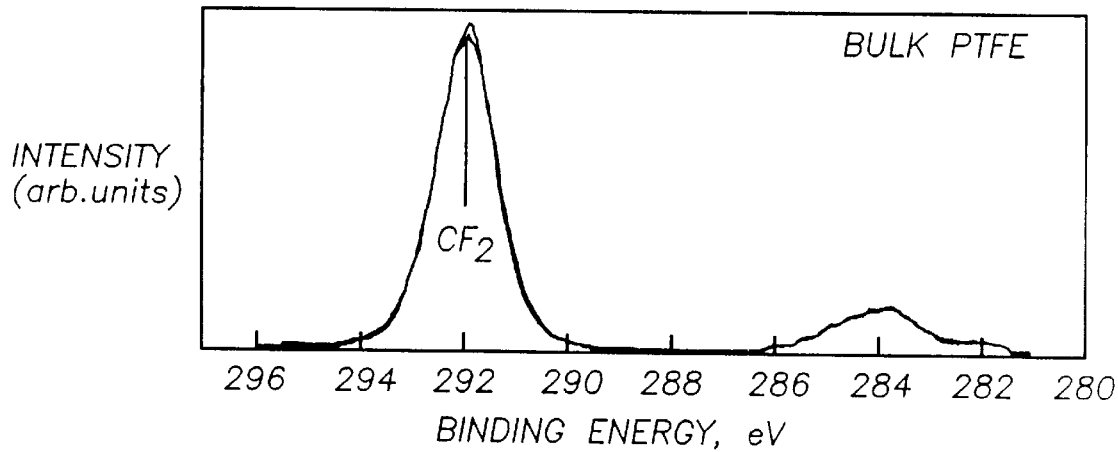

In dramatic contrast, as shown in the plot of FIG. 3B, the pulsed-PECVD process provided by the invention resulted in a film having a $CF_2$ fraction of about 65%. This $CF_2$ fraction corresponds to an F/C ratio of about 1.9. FIG. 3C provides the Carbon-1s X-ray spectrum for bulk PTFE for reference. Note the very close similarity between the spectrum for the film produced by pulsed-PECVD and that of bulk PTFE. This quantitatively demonstrates that the pulsed-PECVD process produces a film having materials properties that much more closely resemble that of bulk PTFE. Also note that the oxygen content of the PECVD films produced using the monomer HFPO was less than about 2 atomic %. Some or all of this oxygen constituency may result from the films' exposure to atmospheric conditions, rather than processing conditions.

The fraction of crosslinks in the two films was determined based on deconvolution of the XPS spectra of the films. In this determination, the number of network-forming bonds of the XPS-resolvable $CF_3$, $CF_2$, CF, and C—CF groups are taken to be 1, 2, 3, and 4, respectively. This assignment assumes that the number of carbon—carbon double bonds is small. Of these four resolvable groups, only the groups having more than 2 bonds are characterized as crosslinkable, i.e., able to form a network; thus, the CF and C—CF groups are characterized as crosslinks. Accordingly, the compositional crosslinking percentage of a given film can be determined by the XPS deconvolution area of these two groups relative to the total area of the spectrum.

Considering first the XPS spectrum of FIG. 3A for the film produced under continuous-PECVD conditions, it is seen that the CF and C—CF groups make up more than 50% of the total film composition. Accordingly, the film produced under continuous-PECVD conditions is characterized by a crosslinking density of greater than about 50%, and in most conventional continuous-PECVD processes, is likely greater than about 60%.

In dramatic contrast, the XPS spectrum of FIG. 3B for the film produced in accordance with the invention under pulsed-PECVD conditions shows that the majority of the film is composed of $CF_2$ groups. The CF and C—CF groups account for only about 18% of the film composition. Thus, films produced in accordance with the invention are composed of dramatically fewer crosslinking bonds than conventional films, whereby films pursuant to the invention are characterized by a correspondingly dramatic increase in flexibility over conventional films.

In an effort to compare the structural integrity of the film produced under pulsed-PECVD conditions with that of the film produced under continuous-PECVD conditions, the 25 $\mu$m diameter wires having 10 $\mu$m coatings were tied into loops of 800 $\mu$m in diameter. Environmental scanning electron microscopy (ESEM) was employed to examine the condition of the tied wire loops.

Figure 4A:
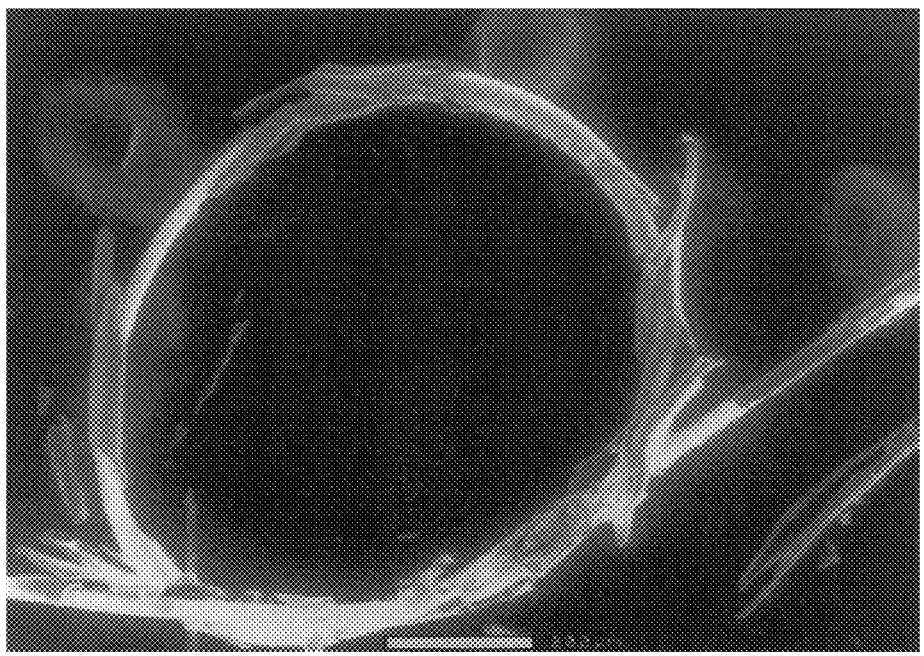
FIGS. 4A and 4B are environmental scanning electron microscopy views of loops of wires coated with the films characterized by the spectral plots of FIGS. 3A and FIGS. 3B, respectively.
Figure 4B:
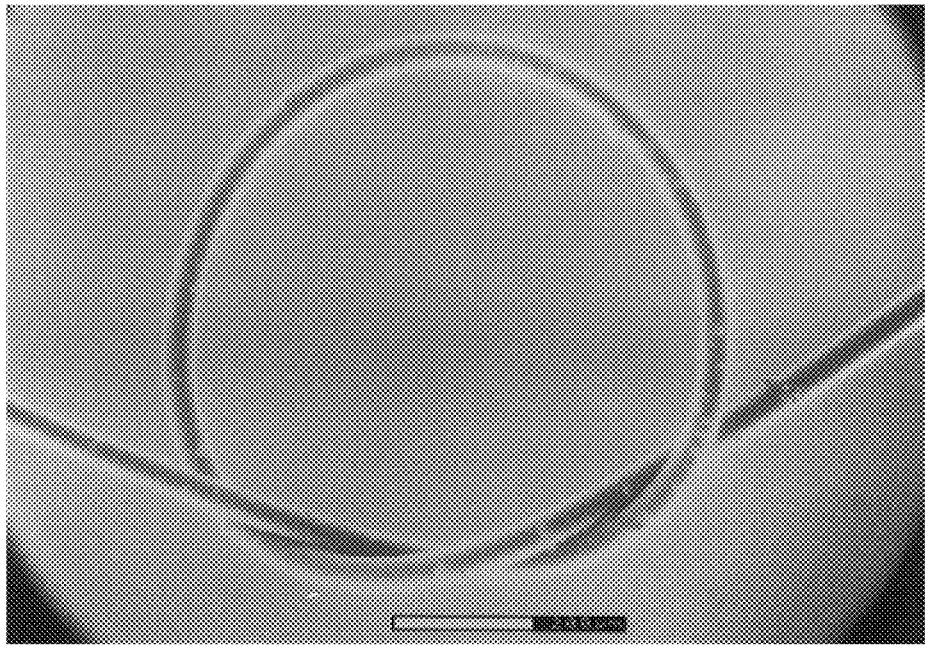

FIG. 4A shows an ESEM view of the tied wire loop coated with a film produced by continuous-PECVD conditions. As shown in the view, the film shattered and actually fell apart as the loop was tied. FIG. 4B shows an ESEM view of the tied wire loop coated with a film produced by pulsed-PECVD conditions. The dramatic improvement in structural integrity is clear from the figure. In this case, the film showed no indication of structural failure; no cracks or peeling were identified at any point along the entire loop; furthermore, no shattering of the film was exhibited at any point. This experiment exemplified that the film produced by pulsed-PECVD conditions proved to be flexible, while the film produced by continuous-PECVD conditions proved to be very brittle. The experiment thus demonstrates with particular clarity that PTFE-like films produced pursuant to the invention, unlike prior fluorocarbon polymer films, have sufficient flexibility to withstand mechanical bending of a structure on which they are coated. This property enables the heretofore unachievable ability to encapsulate flexible structures with a fluorocarbon polymer thin film having the desired materials properties of bulk PTFE, and addresses the many biomedical and microfabrication applications for such a film.

The substantial difference in flexibilities demonstrated by the film produced pursuant to the invention and the film produced under continuous-PECVD conditions can be quantified based on a comparison of the average network connectivity of the films with the network connectivity corresponding to the so-called percolation of rigidity limit. The average connectivity of a continuous random covalent network corresponds to a sum of the compositional fractions of the network correspondingly weighted by the number of bonds of the various compositions. For the films produced in Example 1, the composition includes C—CF, CF, $CF_2$, and $CF_3$; the average connectivity of the films is a sum of the fractions of these compositions, weighted by 4, 3, 2, and 1, respectively, in correspondence to their bonding configuration.

A corresponding connectivity number for each of the films is thus determined based on the fractional areas of the deconvoluted peaks of the XPS spectrum for that film, whereby the fractions to which the bonding weights are to be assigned is determined. For the film produced under continuous-PECVD conditions, an average connectivity number of about 2.6 is given, while for the film produced pursuant to the invention, an average connectivity number of about 2.1 is given, based on the spectra of FIGS. 3A and 3B, respectively. These connectivity numbers are significant when compared to the so-called percolation of rigidity limit. This limit characterizes a material's flexibility; above the limit, a material is characterized as being substantially inflexible and overconstrained, while below the limit, a material is characterized as being flexible.

The average connectivity of a continuous random covalent network should be below about 2.4 to be below the percolation of rigidity limit, i.e., to be flexible. The film pursuant to the invention has an average connectivity of about 2.1, and thus is quantitatively characterized as being flexible. In contrast, the film produced under continuous-PECVD conditions has an average connectivity of about 2.6, and is thus quantitatively characterized as being an overconstrained material. This quantitative analysis supports the wire bending test results, which also confirm the improvement in flexibility achieved by films pursuant to the invention.

Figure 4C:
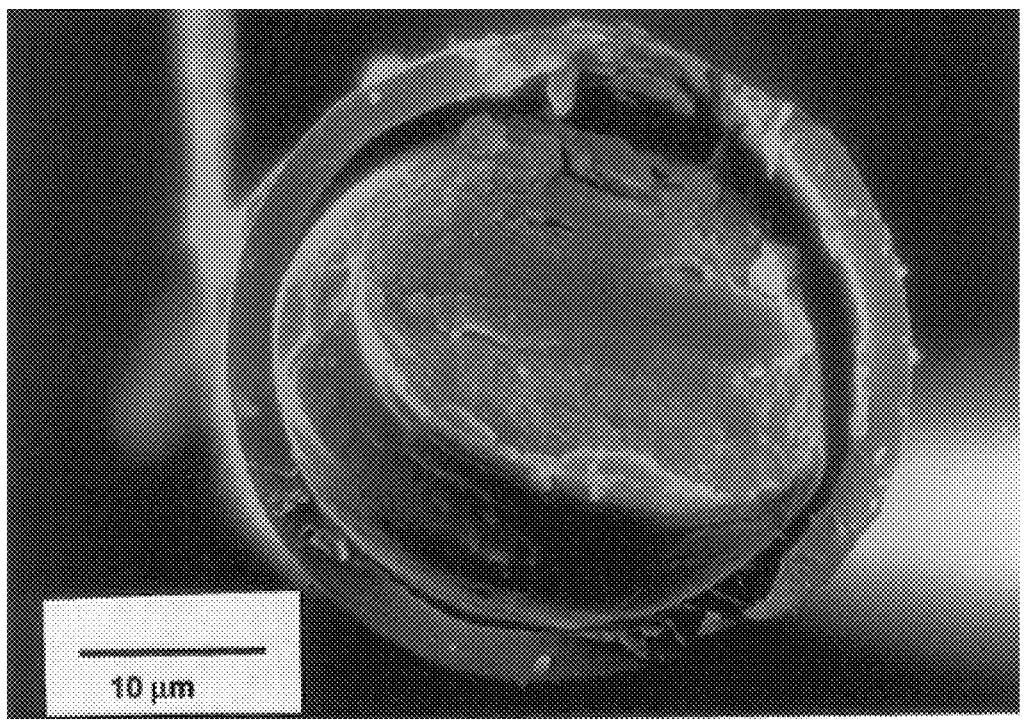
FIG. 4C is an environmental scanning electron microscopy view of a cross-sectional cut through the wire loop of FIG. 4B.

To further examine the strength and flexibility of the film produced under conditions pursuant to the invention, the loop coated with this film was cut using a razor blade. FIG. 4C shows an ESEM view of the cut cross section. No sign or indication of shattering due to brittleness was found; the film retained its integrity as-cut.

Factors believed to influence the mechanical flexibility of PECVD films in general include film morphology, mismatch in the coefficient of thermal expansion between the film and the underlying substrate, and the chemical composition of the film. In both the pulsed- and continuous-PECVD processes carried out for the experiment described above, the film growth rates were estimated to be about 10±2 Å/s, and the wire temperatures during the deposition were assumed to be similar due to identical backside electrode cooling configurations and electrode geometries. Accordingly, the morphology and degree of thermal mismatch for both coated wire samples were assumed to be similar This leads to the conclusion that the chemical composition of the film produced by the pulsed-PECVD conditions is the determining factor for that film's flexibility. Indeed, it is understood that the lower crosslink density of the film produced by the pulsed-PECVD conditions, as well as the fluorine-rich composition of the film, provides the flexibility demonstrated by the film.

Nuclear magnetic resonance measurements were undertaken to examine the particular morphology of the film produced by pulsed-PECVD conditions. It was found that the fluorocarbon thin film was substantially amorphous in nature. This is advantageous in that various film properties, such as dielectric properties, are accordingly isotropic in nature. In contrast, bulk PTFE was found to be partially crystalline in morphology. This bulk morphology accounts for several unwanted characteristics, including very low solubility. Films produced by the pulsed-PECVD process of the invention thereby provide advantages in morphology over that of the corresponding bulk material.

To investigate further materials properties of the film produced by pulsed-PECVD conditions, the refractive index of the film was determined using standard ellipsometry techniques. It was found that the refractive index of the film was about 1.36±0.03. The reported refractive index of bulk PTFE is about 1.38. This measurement provides further evidence for the chemical resemblance of the film produced by pulsed-PECVD conditions to bulk PTFE.

EXAMPLE 2

A 0.5 $\mu$m-thick fluorocarbon film was deposited on a silicon wafer substrate under the pulsed-PECVD conditions of Example 1; no adhesion promoter was employed. The film was scored into 100 1 mm×1 mm squares across the substrate using a razor. The adhesion of the film to the underlying substrate was tested by a conventional tape test. No failure for any of the 100 squares occurred, indicating that the film provides a very high degree of adhesion; this quality is particularly important for coating complex flexible structures that are bent during operation.

EXAMPLE 3

Figure 5:
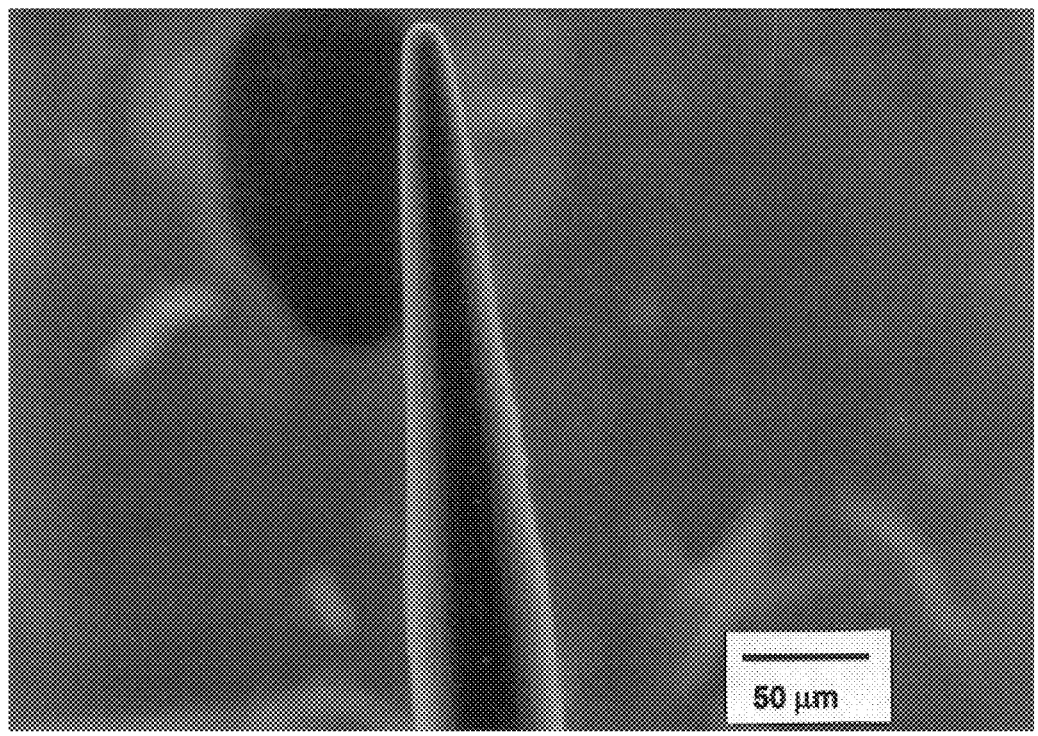
FIG. 5 is an environmental scanning electron microscopy view of a neural probe coated with a fluorocarbon polymer film produced by a pulsed-plasma-enhanced chemical vapor deposition process in accordance with the invention.

To further demonstrate the conformal coverage attainable by a pulsed-PECVD process in accordance with the invention, a 9 μm-thick fluorocarbon film was deposited on an iridium neural probe under the pulsed-PECVD conditions of Example 1. The iridium probe was provided by Huntington Medical Research Institute (HMRI) of Pasadena Calif.; such probes are employed, e.g., to measure electrical impulses emitted from sensitive areas of the human brain. The probe included a cylindrical shaft of about 45 μm in diameter, tapering to an end tip of about 5 μm in diameter. During the deposition process, the probe was supported in a bulk PTFE block in a configuration as described above. The probe's electrical potential floated during the deposition, i.e., was allowed to equilibrate to the potential of the plasma. FIG. 5 shows an ESEM view of the coated probe. Note that the probe coating was uniform along the entire extent of the probe, including the very narrow tip portion. This indicates that the deposition process enables both conformability and uniformity along minute structures.

EXAMPLE 4

The strength, as well as conformability, of a fluorocarbon film produced by the pulsed-PECVD process of the invention was examined by depositing a 28 μm-thick fluorocarbon film on a silicon micro-ribbon cable. The cable was about 100 μm-wide, about 1 centimeter-long, and about 12 μm in thickness, and was configured as a neural probe. The deposition process conditions of Example 1 were carried out, with the electrical potential of the ribbon set at the floating potential of the plasma.

Prior to the deposition process, the micro-ribbon cable was manually bent to form a 90 degree angle. This was accomplished by placing each of the two ends of the ribbon in a separate metal tube having dimensions similar to that of the ribbon. The two tubes were in turn positioned in corresponding holes drilled into a PTFE block. The tubes were used to bend the ribbon and maintain the desired 90 degree curvature. The bent structure was then maintained in this position during the deposition by the tubes and PTFE block configuration. At the end of the 28 μm deposition process, the micro-ribbon cable was removed from the support tubes. It was found that the cable maintained the 90 degree configuration. This demonstrates that the deposition processes provided by the invention can be employed as casting techniques that not only accomplish physical casting of a structure into a desired configuration, but that at the same time provide encapsulation of the structure with a desirable PTFE-like film that itself is the casting material. As will be recognized by those skilled in the art, the nature of the structure and desired structural configuration, as well as other factors, sets the preferable thickness of the casting film. Films as thin as a few microns are acceptable for many applications.

A second deposition process is provided by the invention for forming a fluorocarbon polymer thin film having materials properties like that of bulk PTFE. In this second process, a thermal, rather than rf power, input excitation is employed to produce reactive gas phase species in a chemical vapor deposition environment. This thermal-excitation process reduces the production of dangling bond defects in a deposited film to an even larger extent than the pulsed-PECVD process of the invention. Recall that dangling bond film defects result to a great extent from film ion bombardment during a chemical vapor deposition process. The pulsed-PECVD process of the invention significantly reduces such ion bombardment by employing intervals of plasma excitation, rather than continuous plasma excitation as is conventional. In the thermal chemical vapor deposition (thermal-CVD) process provided by the invention, substantially no ion bombardment occurs, because no substantial electric field is generated in the deposition chamber to attract the charged ions to the film as it is deposited.

Figure 6:
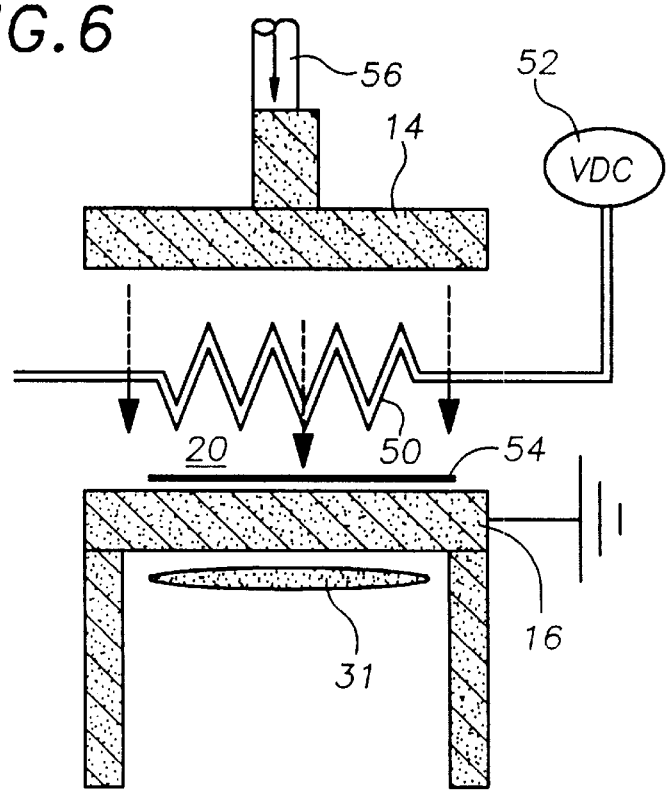
FIG. 6 is a side-view schematic diagram of a hot-wire filament apparatus for use with the vacuum chamber apparatus of FIG. 1 in a thermal chemical vapor deposition process in accordance with the invention.

Referring now to FIG. 6, the thermal-CVD process can be carried out in a vacuum deposition chamber substantially identical to that described above and shown in FIG. 1, with the addition of a heated surface, e.g., a hot-filament 50, as shown in FIG. 6. The hot-filament or other heated surface is preferably provided in a position relative to the input feed gas flow such that the input feed gas flows in the vicinity of the heated structure; whereby the gas is pyrolyzed to produce reactive deposition species. For example, as shown in FIG. 6, a hot-filament 50 can be positioned just below a shower-head electrode 14, here unpowered, such that gas injected to the chamber through the shower-head electrode passes over the hot-filament. The hot-filament can be heated by, e.g., resistive heating. In this case, a dc voltage source 52 is provided to apply the heating voltage to the filament, consisting of, e.g., a Ni/Cr wire.

The lower electrode 16, to which no electrical contact need be made in this case, is preferably maintained at a temperature lower than that of the hot-filament such that reactive species produced in the vicinity of the filament are transported to the wafer, where they deposit and polymerize. Cooling coils 31, or other appropriate cooling mechanism, can be employed to maintain a substrate 54 or other structure supported on the lower electrode at a desired temperature.

Thermal excitation mechanisms other than a hot-filament are equally suitable for the thermal-CVD process. Indeed, it is preferable that the selected thermal mechanism, together with the gas delivery system, provide both uniform gas input and uniform pyrolysis of the gas. A hot-filament pyrolysis configuration described above may not, in all cases, provide the desired pyrolysis uniformity. Hot windows, electrodes, or other surfaces, as well as heated walls of the deposition chamber, can alternatively be employed in pyrolysis configurations aimed at producing uniform gas pyrolysis.

In one alternative, the upper shower-head 14 is itself heated, whereby input feed gas is pyrolyzed as it passes through the shower-head. Such heating can be accomplished by, e.g., applying a dc voltage to the shower-head, which preferably consists of, e.g., aluminum or stainless steel. As the input feed gas is delivered from the feed gas source to the heated upper shower-head, the gas preferably is maintained at a temperature at which it is not pyrolyzed, such that substantially all pyrolysis occurs only once the gas enters the shower-head. In this case, of course, an additional hot-filament is not needed in the deposition chamber.

In a similar alternative, the upper shower-head is outfitted with an array of tubes, each shower-head hole having a tube protruding from it. Such tubes consist of, e.g., anodized aluminum or stainless steel In this case, the shower-head is not itself heated. Instead, the tubes protruding from the shower-head are configured to fit into a corresponding array of holes in a heated plate suspended just below the showerhead, such that the tubes extend to some depth, e.g., substantially through, the holes in the plate. In this configuration, gas in the shower-head passes from the shower-head through the tubes and through the heated plate, whereby the gas is heated at the lower surface of the plate as it exits the tubes. This produces a plane of pyrolyzing gas that is substantially parallel to the lower electrode. As a result, both uniform gas injection and uniform pyrolysis of gas is achieved. Accordingly, this enables production of a substantially uniform reactive gas species environment in the vicinity of an object to be coated by the deposition process. As will be recognized by those skilled in the art, this pyrolysis configuration is therefore preferable for applications in which deposition uniformity is of importance, e.g., in the case of deposition on a large substrate or other object, or a spaced array of substrates or other objects in, e.g., a production environment. Preferably, the tubes connected between the shower-head and the heated plate are slightly smaller in diameter than the holes in the heated plate, such that no substantial pyrolysis occurs until the gas exits the tubes and at the plate lower surface. Additionally, the heated plate is preferable suspended slightly below the shower-head such that the shower-head is not substantially heated by the plate. The plate is preferably formed of, e.g., aluminum or stainless steel, is thick enough to produce uniform heating, and is heated by conventional techniques.

In another alternative technique, the input feed gas is heated in, e.g., the gas delivery tube 56 connecting the gas feed source (18 in FIG. 1) to the upper shower-head 14. Here, the pyrolyzed gas is preferably piped to the location of the substrate or other structure to be coated in a manner similar to that for conventional downstream-ashing processes. In yet another pyrolysis configuration, a cold feed gas is mixed with a hot inert gas, such as argon, in the deposition chamber. In this case, the inert gas is injected and heated by, e.g., one of the processes described above. Mixture of the heated gas with the cold input feed gas results in pyrolysis of the feed gas. This pyrolysis technique has the advantage of eliminating a pyrolysis surface in the chamber that itself is coated with the reactive gas species produced by the pyrolysis. Other direct heating techniques, e.g., laser heating techniques, can also be employed, as can be employed in general a wide range of other pyrolysis mechanisms.

Like the pulsed-PECVD process, the thermal-CVD process accommodates fluorocarbon polymer thin film deposition on a wide range of substrates and three-dimensional structures. Accordingly, the wire holders and probe support blocks described above, as well as other suitable structural supports, can be employed for enabling film deposition on a desired structure. The only requirement imposed by the thermal-CVD process on structural supports is the ability to maintain a supported structure at a desired temperature that preferably is lower than the pyrolysis temperature.

The thermal-CVD process of the invention contemplates use of any feed gas that provides a monomer which can be pyrolyzed to provide difluorocarbene species ($CF_2$) for producing a fluorocarbon polymer film having a high fraction of $CF_2$ groups and a low degree of polymer crosslinking. For example, the HFPO monomer described above is understood to decompose under pyrolysis to form a fluorinated ketone and the desired difluorocarbene. The fluorinated ketone is relatively stable, compared with the difluorocarbene. This is understood to lead to a high $CF_2$ content in a film as polymerization occurs at the film deposition surface. Oxygen present in the monomer is tied up in the relatively unreactive ketone decomposition byproduct, whereby little oxygen is incorporated into the film. Thus, as shown in this example, a wide range of monomer gases, which may include various constituents, can be employed to produce the desired fluorocarbon thin films. As will be recognized by those skilled in the art, the list of monomers given above, as well as other suitable monomers, can be employed.

As with the pulsed-PECVD process, the thermal-CVD process can be accomplished under the wide range of process conditions given previously. The lower electrode temperature is preferably maintained at a temperature lower than the pyrolysis temperature of the selected monomer gas. Specifically, the temperature of the lower electrode is preferably maintained low enough to favor polymerization under the partial pressure of a given reactive species employed in the deposition process. It is also preferable that the partial pressure of the reactive species be kept to a low level that prevents homogeneous gas-phase reactions, which could cause particle production in the gaseous environment rather than on the object surface to be coated. As with the pulsed-PECVD process, pre-adhesion promotion processes and post-annealing processes can be paired with the thermal-CVD process.

Fluorocarbon polymer thin films produced pursuant to the thermal-CVD process of the invention are characterized by the flexibility and structural integrity, as well as dielectric properties, of films produced pursuant to the pulsed-PECVD process of the invention, and are further characterized by an even higher compositional $CF_2$ fraction and an even lower dangling bond concentration than that of films produced pursuant to the pulsed-PECVD process. Conformal coverage of a wide range of three-dimensional structures for providing a flexible encapsulating structural coating having PTFE-like properties is thus well-enabled by the thermal-CVD process.

EXAMPLE 5

A fluorocarbon polymer thin film was produced in accordance with the thermal-CVD process of the invention by flowing 12.5 sccm of undiluted HFPO (from PCR, Inc.) of about 99% purity, into a parallel plate vacuum deposition chamber, like that described above, maintained at a pressure of about 1 Torr. A hot-filament of Ni/Cr wire was positioned under the upper shower-head. Using a dc voltage, the hot-filament was maintained at a temperature of about 673 K. A water cooling arrangement was employed to maintain the lower chamber electrode at a temperature of about 293±3 K. A silicon substrate was supplied on the cooled electrode to deposit a fluorocarbon polymer film on the substrate.

Figure 7:
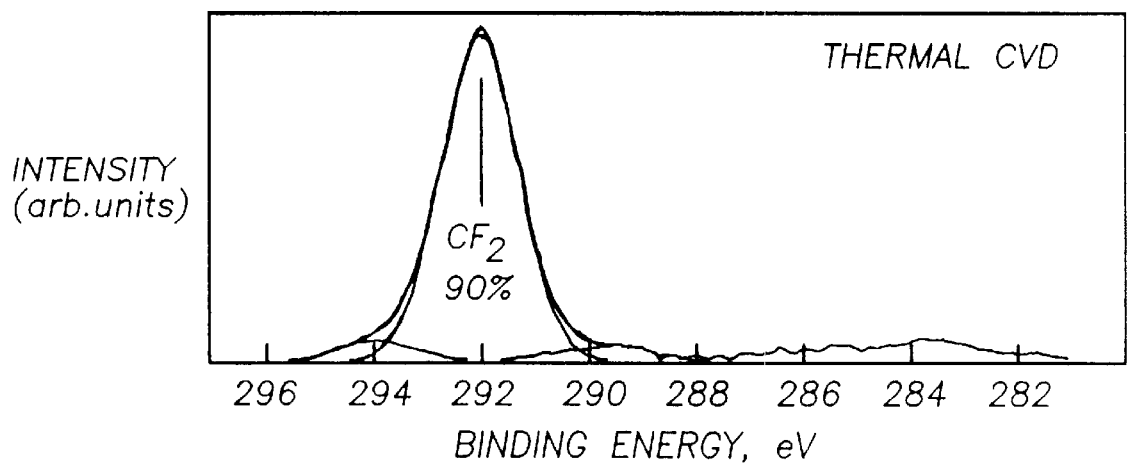
FIG. 7 is a plot of the carbon-1s X-ray photoemission spectra for a fluorocarbon polymer thin film produced by a thermal chemical vapor deposition process in accordance with the invention.

FIG. 7 shows a plot of the carbon-1s X-ray photoelectron spectrum for the deposited film. The dominate peak at 292 eV is indicative of the $CF_2$ bonding environment; indeed, deconvolution indicates that $CF_2$ bonding accounts for about 90% of the spectra. Comparing this plot with that of a film produced by the pulsed-PECVD process of the invention, as shown in FIG. 3B, it is seen that the film produced under thermal-CVD conditions has a higher $CF_2$ content; the film produced under pulsed-PECVD conditions is characterized by a $CF_2$ fraction of about 65%. It must be noted, however, that both the pulsed-PECVD and thermal-CVD processes produce films having a marked increase in $CF_2$ fraction over films produced by, e.g., continuous-PECVD conditions. As shown in FIG. 3A, a film produced under continuous-PECVD conditions is characterized by a $CF_2$ fraction of only about 21%. Recall that bulk PTFE, the spectrum for which is shown in FIG. 3C, is characterized by substantially 100% $CF_2$, neglecting end groups, which account for only about 1/10,000 of the compositional units. The small peak in the bulk PTFE spectrum that is not $CF_2$ is likely to be due to carbon contamination from absorbed atmospheric hydrocarbons rather than from the bulk PTFE composition itself.

The crosslinking density of the film produced under thermal-CVD conditions was determined based on deconvolution of the XPS plot, in the manner given above in Example 1. It was found that crosslinking lower than about 15%, and even as low as about 5%, is obtainable by the thermal-CVD process. This very low crosslinking density enables a high degree of flexibility in the deposited films.

Based on these results, it is clear that the thermal-CVD process of the invention provides a fluorocarbon polymer thin film having a chemical composition that very closely resembles that of bulk PTFE. As with the pulsed-PECVD process of the invention, this enables a wide range of thin film applications for PTFE that heretofore have been only sub-optimally addressed by conventional polymer films.

To investigate further materials properties of the film produced by thermal-CVD conditions, the refractive index of the film was determined using standard ellipsometry techniques. It was found that the refractive index of the film was about 1.35±0.03. The reported refractive index of bulk PTFE is about 1.38. This measurement thus provides further evidence for the chemical resemblance of the film produced by thermal-CVD conditions to bulk PTFE.

EXAMPLE 6

A silicon substrate was subjected to the thermal-CVD process conditions of Example 5, with the hot-filament temperature held at about 691 K. It was found that the film deposition rate under these conditions was about 1.8 $\mu$m/hour. With a deposition cycle of several hours, a film thicker than about 10 $\mu$m was deposited. This demonstrates that a wide range of coating thicknesses can be provided by the thermal-CVD process in reasonable and practical processing times.

EXAMPLE 7

Figure 8:
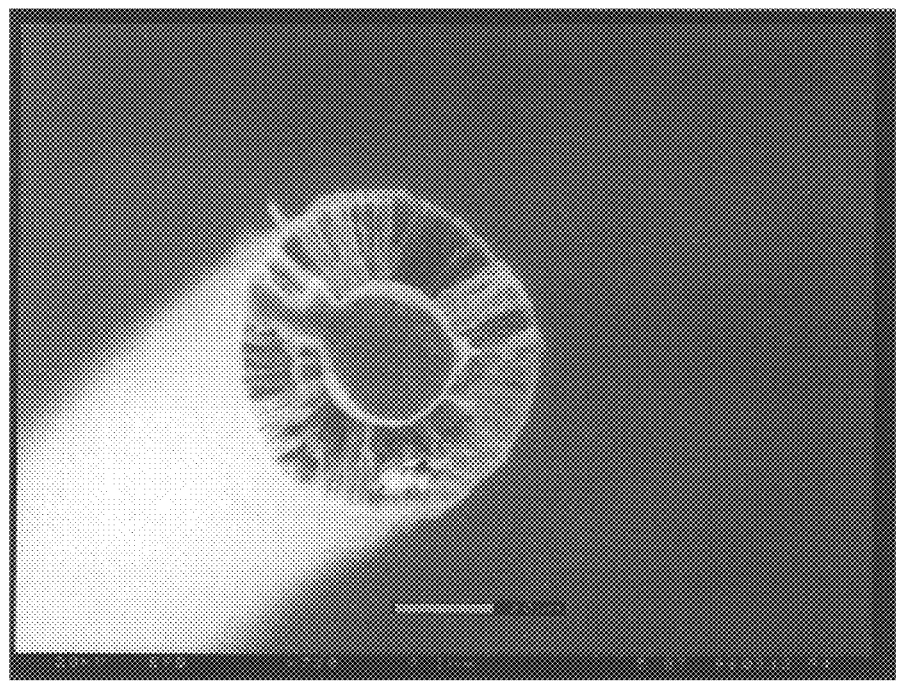
FIG. 8 is an environmental scanning electron microscopy view of a cross-sectional cut through a wire coated with a thin film produced by a thermal chemical vapor deposition process in accordance with the invention.

A length of stainless steel wire having a diameter of about 25 $\mu$m was subjected to the thermal-CVD process conditions of Example 5. A wire holding ring like that shown in FIG. 2 was employed to support the wire during the deposition process. The deposition was carried out to produce a wire coating thickness of about 16 $\mu$m. The structural integrity of the coating was tested by cutting through the thickness of the wire with a razor blade. FIG. 8 shows an ESEM view of the cut cross section. As shown in the figure, the film coating maintained its integrity as-cut; no sign or indication of shattering due to brittleness was found. The coating produced by thermal-CVD conditions is thus demonstrated to exhibit the superior structural characteristics of bulk PTFE.

EXAMPLE 8

Fluorocarbon films of about 0.6 $\mu$m in thickness and about 8 $\mu$m in thickness were deposited on silicon substrates under the thermal-CVD conditions of Example 5; no adhesion promoter was employed. The films were scored into 100 1 mm×1 mm squares across the substrates using a razor. The adhesion of the films to the underlying substrates was tested by a conventional tape test. No failure for any of the squares occurred, indicating that over a wide range of film thicknesses, a very high degree of adhesion is provided by the thermal-CVD process; this quality is particularly important for coating complex flexible structures that are bent during operation.

EXAMPLE 9

Electron spin resonance (ESR) measurements were undertaken to ascertain the dangling bond density of a film produced under thermal-CVD conditions, and to compare this density with that of films produced under pulsed-PECVD conditions and continuous-CVD conditions. A film was produced using the thermal-CVD process of Example 5 with the hot-filament temperature maintained at about 648 K. A film was also produced under the pulsed-PECVD conditions of Example 1.

In the ESR measurements, it was assumed that the deposited films have the same density as that of bulk PTFE, which is about 2.2 g/cm$^3$. For the film deposited under thermal-CVD conditions, a dangling bond density of about $1.2 \times 10^{18}$ spins/cm$^3$ was determined. These defects have a g-value of about 2.0108 and a large linewidth of about 60 G. For the film deposited under pulsed-PECVD conditions, a dangling bond density of between about $0.8 \times 10^{18}$–$13 \times 10^{18}$ spins/cm$^3$ was determined. In contrast, the dangling bond density of films produced under continuous-PECVD conditions is reported to typically range between $10^{18}$–$10^{20}$/cm$^3$. Thus, films pursuant to both the thermal-CVD process and pulsed-PECVD process of the invention have a relatively low dangling bond density compared to that of conventional PECVD polymer films.

It must be noted that the dangling bond density of a given film produced under thermal-CVD conditions is a function of the pyrolysis mechanism. For example, the pyrolysis mechanism of Example 5, namely a hot-filament, is understood to introduce metal atoms into the depositing film as a result of evaporation of metal atoms from the filament during the pyrolysis. Accordingly, some amount of the ESR spin density given above for the film produced under these conditions is understood to be attributable to hot-filament metal evaporation.

As discussed earlier, various direct-pyrolysis mechanisms, and other heating mechanisms, can be employed to pyrolyze the input feed gas without the use of a hot-filament. These mechanisms reduce or eliminate metal contamination of a depositing film, and correspondingly are characterized by a lower dangling bond density, e.g., a density less than about $10^{17}$. Accordingly, one of these pyrolysis mechanisms is preferably employed in applications for which a low dangling bond density is desired.

Turning now to other fluorocarbon polymer thin film deposition processes in accordance with the invention, there is contemplated a wide range of hybrid PECVD/thermal-CVD deposition processes for customizing materials properties of a film in situ during the film deposition process. In a first such process in accordance with the invention, two or more deposition intervals are defined, each interval employing one or both PECVD and thermal-CVD conditions. For example, during a deposition initiation interval, one of continuous- or pulsed-CVD conditions are provided; then during a growth phase interval, thermal-CVD conditions alone or in combination with PECVD conditions are provided; followed by a final interval during which continuous- or pulsed-CVD conditions are provided.

Processes such as this example three-interval process provide several advantages. First, it is recognized that ion bombardment aids in initiation of deposition of gas species onto a substrate or other structure, due, e.g., to the electric field bias inherent in the plasma excitation conditions. This in turn enhances the adhesion of the depositing film to the underlying substrate or structural surface. Thus, the ion, neutral, and free radical production provided by a plasma process can be advantageously employed at the start of the deposition to aid in film nucleation and to enhance film adhesion. The film surface roughness characteristic of PECVD deposition conditions also aids in adhesion. Although the pulsed-CVD process conditions produce superior results, continuous-CVD conditions can also be employed for this initiation interval.

During a sequential growth phase, the plasma is extinguished and the gas heating is commenced, whereby only thermal processes produce the reactive gas species that polymerize on the surface of the substrate or structure. As explained in detail above, such a thermal process produces a film having a very low dangling bond concentration, a relatively high $CF_2$ fractionality, and a low degree of crosslinking. These properties result in a film having material properties that very closely resemble those of bulk PTFE.

During the thermal-CVD growth interval, the properties of the film can be further customized. For example, a plasma can be ignited for one or more brief sub-intervals to reduce film crystallinity, to enhance crosslinking, or to otherwise modify the film characteristics in a depth-dependent manner. Alternatively, a relatively low-power plasma can be maintained during either the entire duration or a portion of the growth interval duration; results similar to that produced by the sub-interval plasma sequence are here achieved as a result of the correspondingly relative low level of ions. As in the initiation interval, either continuous- or pulsed-PECVD can be employed in either alternative.

During the final deposition process interval, plasma conditions are provided until the end of the deposition cycle. This results in a deposited film surface topology that generally enhances the adhesion of a second film material to be subsequently deposited on the fluorocarbon film. In this final deposition process interval, the feed gas composition can also be selected to enhance film surface adhesion characteristics. For example, oxygen and/or silicon-bearing gases can be added to the feed gas composition to produce a film surface having topological and chemical properties that are conducive to adhesion as well as providing, e.g., chemical stability such as oxidation resistance.

The three-interval deposition process just described is but one example of a wide range of process variations contemplated by the invention. As will be recognized by those skilled in the art, other combinations of thermal-CVD and PECVD conditions can be employed to achieve customization of a fluorocarbon polymer thin film as the film is deposited. The degree of crosslinking, density of dangling bonds, and fractional composition of $CF_2$ desired for a given film can be controlled by way of the thermal-CVD and PECVD process combinations. Deposition rate can also be controlled by process PECVD and thermal-CVD combinations; for example, deposition rate can be increased by providing PECVD and thermal-CVD conditions simultaneously. The examples discussed earlier provide a guide to selection of corresponding process parameters.

Whatever sequential or simultaneous conditions employed, they preferably are selected based on a given application. For example, a three-interval process of PECVD, thermal-CVD, and then PECVD conditions can be employed to produce a graded interface between an underlying substrate or layer, a fluorocarbon film having characteristics of thermal-CVD processing, and an overlying layer. This enables customization of the lower and upper interfaces to accommodate varying mechanical and chemical conditions. As will be recognized by those skilled in the art, many other film configurations can be addressed by the combination processes provided by the invention.

EXAMPLE 10

A fluorocarbon polymer thin film was produced in accordance with the combination thermal/PECVD process provided by the invention on a silicon substrate. In the process, a hot-filament at a temperature of about 691 K was employed to pyrolyze HFPO monomer gas flowing at about 12.5 sccm into the deposition chamber. The substrate was supported on the lower grounded electrode, which was back-side cooled to a temperature of about 293±3 K. A chamber pressure of about 1 Torr was employed; the chamber configuration was in other respects the same as described above. Simultaneously with the pyrolysis mechanism, a pulsed-PECVD environment was provided. This was accomplished with an rf power density of about 2.7 $W/cm^2$; the pulsed plasma excitation duty cycle consisted of excitation on-time interval of about 10 milliseconds and an off-time interval of about 400 milliseconds.

Compositional XPS characterization of the produced film indicated that at least about 85% of the film was composed of $CF_2$ groups, with $CF_3$ and CF groups making up only about 15% of the composition. The index of refraction of the film was found to be about 1.35±0.03. Thus, the film was found to exhibit properties very close to that of bulk PTFE. Furthermore, the combination process was found to be characterized by a deposition rate of at least about 1.8 $\mu$m/hour. This indicates that the combination process is viable for production environments.

Considering applications of the various fluorocarbon polymer thin films provided by the invention, the examples discussed above clearly demonstrate the advantageous use of the films as flexible PTFE-like coatings for biomedical devices like implantable probes and device wires. Heretofore, the high degree of crosslinking and low $CF_2$ compositional fraction characteristic of conventional polymer films have rendered such films inferior as coatings for biomedical devices. The demonstrated flexibility and mechanical integrity, along with the conformability and chemical stability of films pursuant to the invention now enable encapsulation of biomedical devices with a PTFE-like coating that can be relied upon even in such crucial applications.

Of course, the encapsulation process provided by the invention can be extended beyond biomedical applications to any application for which a PTFE-like coating is desired. For example, razor blades such as those used conventionally for shaving, can be conformally coated with films pursuant to the invention to lubricate the razor blade surface.

Films pursuant to the invention can also be used for producing a low-friction coating on mechanical parts of both macroscopic and microscopic dimensions. The deposition processes provided by the invention are especially well-suited for providing low-friction coatings on microfabricated moving parts, e.g., micromachined sensor and actuator structures. Such structures are typically manufactured using microfabrication processes, such as vapor-deposition processes, and typically employ microfabrication materials, such as silicon, that are compatible with such processes. The deposition processes provided by the invention enable coating and encapsulation of moving micromechanical structures to reduce friction typically exhibited by such structures.

Films pursuant to the invention can also be employed as separation membranes to, e.g., filter various chemical species out of a gas or liquid that is delivered through the membrane. The low water permeability of the films enables separation of gases out of a stream of water- or steam-containing media. The low water permeability characteristics of the films can also be employed simple as a coating to reduce the water permeability of a structure, e.g., a porous structure. As will be recognized by those skilled in the art, there exists a wide range of alternative applications that are well-suited for the characteristics of films pursuant to the invention for addressing thin film applications of bulk PTFE.

The fluorocarbon polymer thin films of the invention find particularly superior application to semiconductor microfabrication processing. Microfabricated integrated circuit designs increasingly call for reduction of circuit signal propagation delay, reduction of circuit and device power consumption, and reduction of cross-coupling of circuit signals and noise signals in adjacent circuit connections, among other increasing requirements. All of these requirements point to use of interlayer dielectric materials having reduced dielectric constants.

Although various organic polymers and microporous materials have been investigated as low dielectric constant (low-k) materials, these have all fallen short of the range of necessary film properties. For example, in addition to low-k, interlayer dielectric materials are increasingly required to possess high dielectric strength, high surface and bulk resistivity, low stress, high thermal stability, low permeability to water, and good adhesion. In addition, the materials preferably are uniform and pin hole-free, and can preferably be photolithographically patterned. Furthermore, and importantly, due to increasingly complex circuit topology, interlayer dielectric materials are required to be conformal, i.e., to provide good step coverage over, e.g., metallization layers. Spin-applied materials, e.g., polyimides, that have been considered as interlayer dielectric materials are as a practical matter, not typically acceptable because they cannot meet this conformability requirement. Indeed, as circuit line widths decrease to less than 0.25 $\mu$m, spin-applied materials are not practical. Furthermore, multiple spin-application steps can be required to adequately cover substantial surface topology.

The fluorocarbon polymer thin films provided by the invention are ideally suited as vapor-deposited interlayer dielectric materials for microfabrication applications. Each of the materials requirements just outlined are met by the films, and improvements in materials properties are further provided. CVD processes are inherently compatible with conventional microfabrication processing, and can be configured in a sequence of processing steps that are all carried out in a single deposition chamber or a cluster of chambers. Indeed, the nature of the vacuum deposition chamber accommodates in situ pre-deposition adhesion promoter deposition steps, post-deposition surface-modification steps, and incorporation of feed gas constituents at intervals in the deposition.

Many advantages over conventional interlayer dielectric materials are further provided by the thin films of the invention. For example, unlike spin-applied films, the vapor-deposited films of the invention are characterized by isotropic dielectric properties, due to their generally amorphous character. In addition, the vapor-deposited films do not contain residual solvent, as is common for spin-applied materials.

It has been generally accepted that films deposited under PECVD conditions are unacceptable as an interlayer dielectric material because such films are typically characterized by a significant concentration of dangling bonds. As explained above, both the pulsed-PECVD and thermal-CVD processes of the invention provide films having dramatically reduced dangling bond concentrations. As a result, films pursuant to the invention have reduced dielectric loss, have greatly diminished reactivity with atmospheric water and oxygen, and generally are far superior both chemically and structurally to prior PECVD films. As will be recognized by those skilled in the art, the films pursuant to the invention thus are also excellent as microfabricated circuit barrier and encapsulation layers.

In an example microfabrication sequence, a first layer of metal is deposited on a microfabricated circuit configuration at an appropriate point in the fabrication sequence. The metal layer can be patterned and etched using photolithographic and etch techniques to form desired conducting circuit interconnections. Then, if desired, an adhesion promoter can be applied to the patterned metal, using, e.g., one of the adhesion promoters discussed above. Next, a deposition process in accordance with the invention, e.g., a three-interval process consisting of a first pulsed-PECVD interval, a thermal-CVD interval, and a final pulsed-PECVD interval, is carried out. The resulting fluorocarbon polymer thin film can then be patterned using, e.g., a direct-write process or photolithographic and etching process such as, e.g., an oxygen plasma to form desired interlayer pattern. A chemo-mechanical polishing process, or other dielectric layer planarization process, can then be carried out provide a planar film surface, if desired.

At this point, a second layer of metal can be deposited, and the cycle of metal layer-interlayer dielectric deposition and patterning continued until a desired number of metal layers is achieved. As will be recognized by those skilled in the art, many variations can be incorporated into this process, including, e.g., planarization after each metal deposition step, as well as other fabrication processes.

From the foregoing, it is apparent that the fluorocarbon polymer thin film deposition processes provided by the invention enable production of thin films that are characterized by a low degree of crosslinking, a low density of dangling bonds, and a high compositional $CF_2$ fraction, leading to a very low dielectric constant, conformability, flexibility, and high structural and chemical stability. The invention thereby provides the ability to produce a thin film having materials properties that closely resemble those of bulk PTFE. It is recognized, of course, that those skilled in the art may make various modifications and additions to the example deposition processes described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A method for coating a nonplanar and flexible structure with a flexible fluorocarbon polymer thin film, comprising the steps of:

arranging the nonplanar flexible structure on a structure holder in a configuration in which surfaces of the structure are substantially unmasked and out of contact with each other;

thermally biasing the structure holder to control temperature of the structure;

electrically biasing the structure holder to control electrical potential of the structure;

producing a plasma environment by applying to a monomer gas located between a first plasma excitation power electrode and a second plasma excitation power electrode plasma excitation power characterized by an excitation duty cycle having alternating intervals in which excitation power is applied an in which no excitation power is applied to the monomer gas to ionize the monomer gas and produce reactive $CF_2$ species; and exposing the arranged structure on the structure holder to the plasma environment while controlling the temperature and electrical potential of the structure to induce deposition and polymerization of the $CF_2$ species on the structure.

2. The method of claim 1 wherein the monomer gas comprises hexafluoropropylene oxide.

3. The method of claim 1 wherein the interval of the plasma excitation power duty cycle in which excitation power is applied is between about 100 microseconds and 0.1 seconds, and the interval of the plasma excitation power duty cycle in which no excitation power is applied is between about 100 microseconds and 1 second.

4. The method of claim 3 wherein the interval of the plasma excitation power duty cycle in which excitation power is applied is between about 1 millisecond and 100 milliseconds and provides power of between about 100 and 300 Watts, wherein the interval of the plasma excitation power duty cycle in which no excitation power is applied is between about 350 milliseconds and 450 milliseconds, and wherein the plasma environment is produced at a pressure of between about 1 milliTorr and 10 Torr.

5. The method of claim 1 further comprising the steps of:

exposing the monomer gas to a heat source to pyrolyze the monomer gas and produce a source of reactive $CF_2$ species in the vicinity of the structure; and maintaining the structure substantially at a temperature lower than that of the heat source to induce deposition and polymerization of the $CF_2$ species on the structure.

6. The method of claim 1 further comprising a first step of deforming the structure into a desired configuration.

7. The method of claim 1 wherein the structure comprises a length of wire.

8. The method of claim 6 wherein the length of wire has a diameter of between about 10 microns and about 100 microns.

* * * * *